(12) United States Patent
Kim et al.

(10) Patent No.: US 12,532,464 B2
(45) Date of Patent: Jan. 20, 2026

(54) SEMICONDUCTOR DEVICE INCLUDING SINGLE POLY NON-VOLATILE MEMORY DEVICE AND METHOD OF MANUFACTURING SAME

(71) Applicant: SK keyfoundry Inc., Cheongju-si (KR)

(72) Inventors: Su Jin Kim, Cheongju-si (KR); Min Kuck Cho, Cheongju-si (KR); Jung Hwan Lee, Cheongju-si (KR); In Chul Jung, Daegu (KR)

(73) Assignee: SK keyfoundry Inc., Cheongju-si (KR)

( * ) Notice: Subject to any disclaimer, the term of this patent is extended or adjusted under 35 U.S.C. 154(b) by 646 days.

(21) Appl. No.: 17/743,691

(22) Filed: May 13, 2022

(65) Prior Publication Data
US 2023/0059628 A1   Feb. 23, 2023

(30) Foreign Application Priority Data

Aug. 19, 2021   (KR) .................. 10-2021-0109342
Feb. 16, 2022   (KR) .................. 10-2022-0020346

(51) Int. Cl.
H10D 30/68       (2025.01)
H10B 41/42       (2023.01)

(52) U.S. Cl.
CPC .......... *H10B 41/42* (2023.02); *H10D 30/6892* (2025.01)

(58) Field of Classification Search
CPC .......................... H10B 41/42; H01L 29/42328
See application file for complete search history.

(56) References Cited

U.S. PATENT DOCUMENTS

| | | |
|---|---|---|
| 4,912,676 A | 3/1990 | Paterson et al. |
| 6,541,321 B1 | 4/2003 | Buller et al. |
| 6,602,751 B2 | 8/2003 | Oohashi |
| 6,750,525 B2 | 6/2004 | Yim et al. |
| 6,784,115 B1 | 8/2004 | Ni et al. |
| 6,933,199 B1 | 8/2005 | Wong et al. |
| 7,323,740 B2 | 1/2008 | Park et al. |
| 9,478,555 B2 | 10/2016 | Kaemmer et al. |

(Continued)

FOREIGN PATENT DOCUMENTS

| | | |
|---|---|---|
| KR | 10-2002-0073959 A | 9/2002 |
| KR | 10-2004-0110666 A | 12/2004 |
| KR | 10-0667898 B1 | 1/2007 |

OTHER PUBLICATIONS

Korean Office Action issued on Nov. 24, 2023, in counterpart Korean Patent Application No. 10-2022-0020346 (5 pages in English, 5 pages in Korean).

*Primary Examiner* — Jay C Kim
*Assistant Examiner* — Joshua Scott Wyatt
(74) *Attorney, Agent, or Firm* — NSIP Law

(57) ABSTRACT

A semiconductor device includes: a logic region and a non-volatile memory (NVM) region; a logic gate insulating film disposed on a substrate in the logic region; at least one gate oxidation acceleration ion implantation layer disposed in the NVM region; at least one NVM gate insulating film disposed on the at least one gate oxidation acceleration ion implantation layer; a logic gate electrode disposed on the logic gate insulating film; and at least one NVM gate electrode disposed on the at least one NVM gate insulating film, wherein a thickness of the at least one NVM gate insulating film is equal or greater than a thickness of the logic gate insulating film.

5 Claims, 20 Drawing Sheets

(56) References Cited

U.S. PATENT DOCUMENTS

| | | | |
|---|---|---|---|
| 2014/0073126 A1* | 3/2014 | Shen | H10B 43/40 |
| | | | 257/E21.209 |
| 2015/0221663 A1* | 8/2015 | Tan | H10D 30/6892 |
| | | | 257/300 |
| 2017/0018557 A1 | 1/2017 | Kaemmer et al. | |
| 2020/0075614 A1* | 3/2020 | Huang | H10D 30/6893 |

* cited by examiner

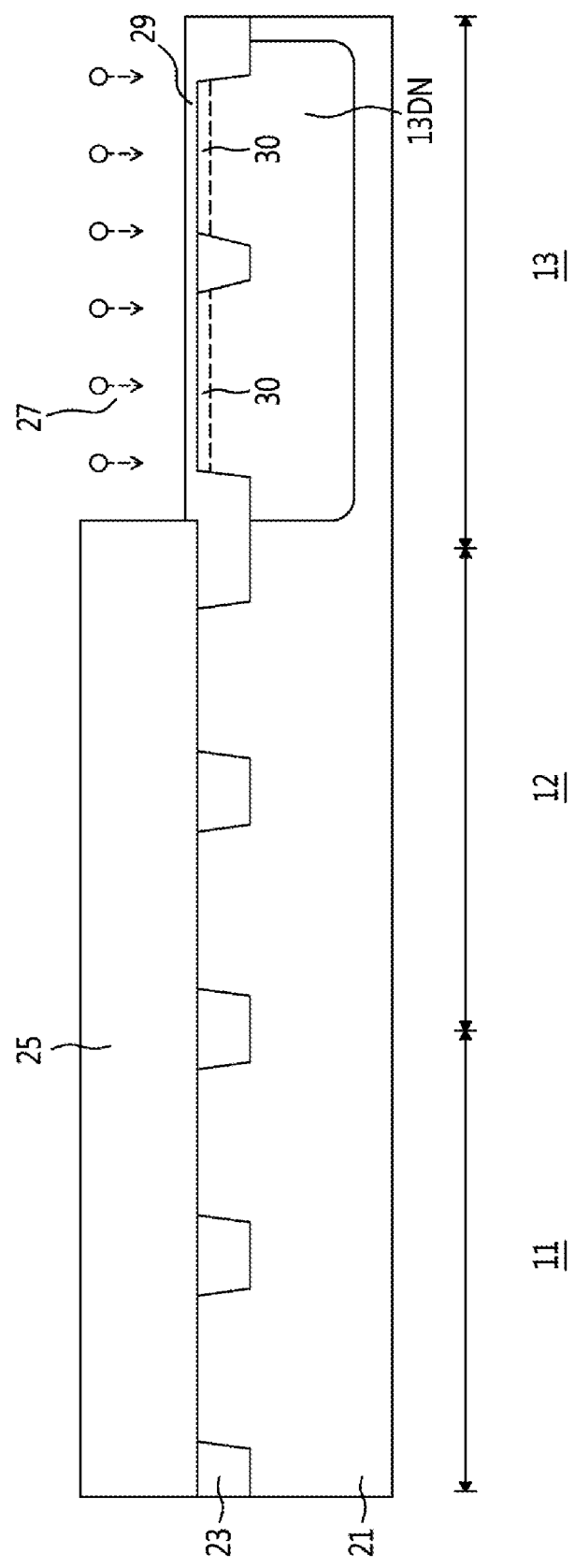

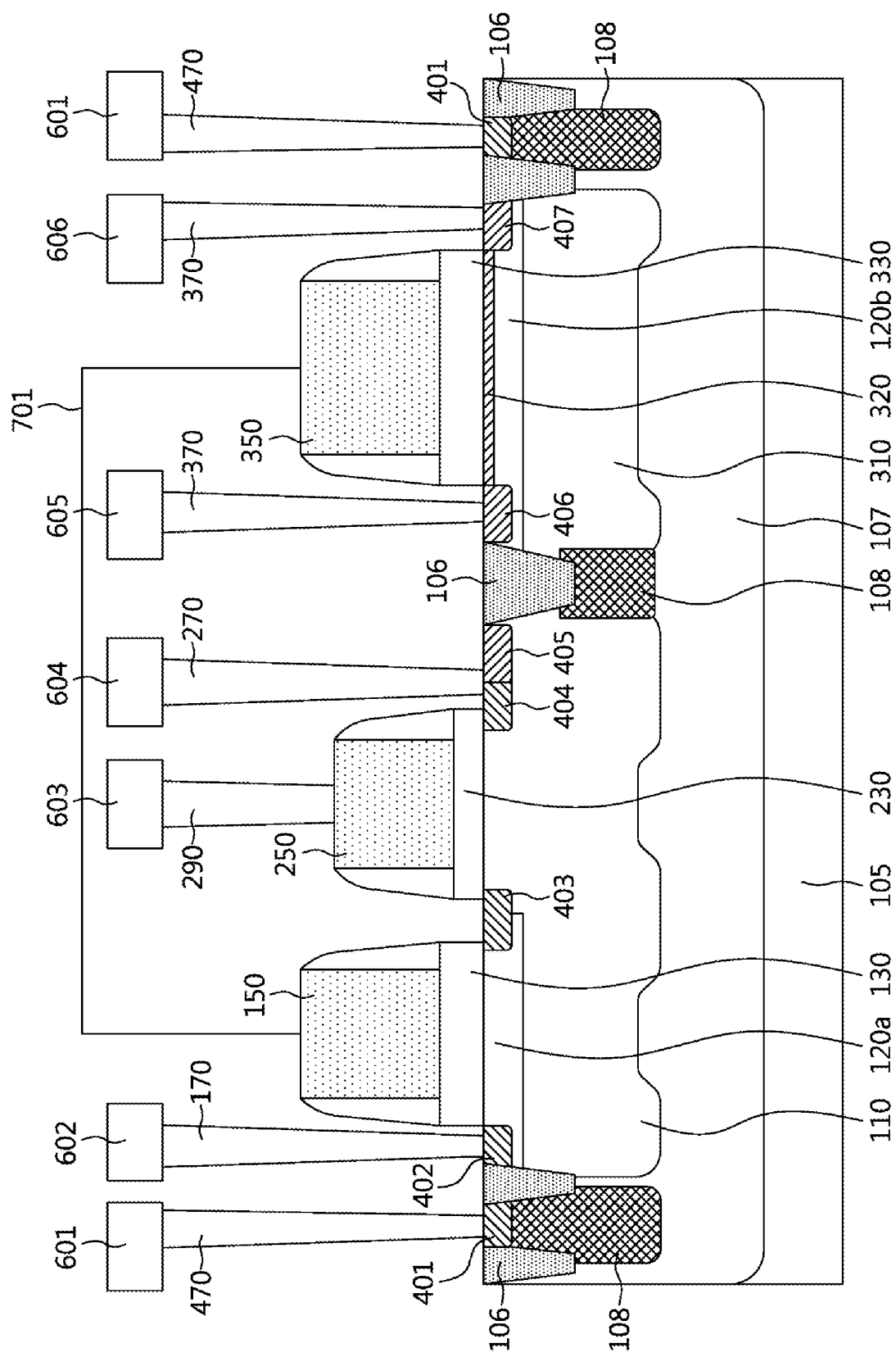

SEMICONDUCTOR DEVICE INCLUDING SINGLE POLY NON-VOLATILE MEMORY DEVICE AND METHOD OF MANUFACTURING SAME

CROSS-REFERENCE TO RELATED APPLICATION

This application claims the benefit under 35 U.S.C. § 119 of Korean Patent Application No. 10-2021-0109342 filed on Aug. 19, 2021 and Korean Patent Application No. 10-2022-0020346 filed on Feb. 16, 2022, in the Korean Intellectual Property Office, the entire disclosures of which are incorporated herein by reference for all purposes.

BACKGROUND

1. Field

The following description relates to a semiconductor device including a non-volatile memory device and method of manufacturing the same.

2. Description of Related Art

A non-volatile memory device (NVM) is implemented in various applications such as Controller IC, MCU, RFID Tag etc., which need data storage and electric writing and deleting with a low power. It is also applied not only for trimming to correct circuit characteristics and to improve yield but also for data storage in numerous semiconductor devices.

A NVM device, LV device, MV device and HV device are formed in a chip by using a CMOS process. Thicknesses of gate insulating films implemented in each of LV device, MV device, and HV device are different. There are various gate insulating films in the NVM device, such as a sensing gate insulating film, a selection gate insulating film, and a control gate insulating film, etc. At least 4-7 or more gate insulating films are desired in a chip with difference thicknesses. Forming multiple gate insulating films is highly complex, and the cost is considerably high, which causes a problem.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, the semiconductor device includes: a logic region and a non-volatile memory (NVM) region; a logic gate insulating film disposed on a substrate in the logic region; at least one gate oxidation acceleration ion implantation layer disposed in the NVM region; at least one NVM gate insulating film disposed on the at least one gate oxidation acceleration ion implantation layer; a logic gate electrode disposed on the logic gate insulating film; and at least one NVM gate electrode disposed on the at least one NVM gate insulating film, wherein a thickness of the at least one NVM gate insulating film is equal or greater than a thickness of the logic gate insulating film.

The at least one NVM gate insulating film may include a gate oxidation acceleration ion implantation layer.

The at least one NVM gate insulating film may include at least one of: a sensing gate insulating film; a selection gate insulating film; and a control gate insulating film.

The at least one NVM gate electrode may include at least one of: a sensing gate electrode disposed on the sensing gate insulating film; a selection gate electrode disposed on the select gate insulating film; and a control gate electrode disposed on the control gate insulating film, wherein the sensing gate electrode and the selection gate are connected with each other.

The sensing gate insulating film may have a thickness greater than a thickness of the selection gate insulating film.

The selection gate insulating film may have a same thickness as a thickness of the logic gate insulating film.

At least one device selected from the group consisting of a SRAM device, a standard cell device, a logic device, a digital device, and an analog device may be disposed on the logic region.

At least one memory selected from the group consisting of an electrically programmable read only memory (EPROM), an electrically erasable programmable read only memory (EEPROM), a flash memory, a multiple time programmable (MTP) memory device, and a one-time programmable (OTP) memory device may be disposed on the NVM region.

The semiconductor device may further include a sensing transistor including the sensing gate insulating film and the sensing gate electrode; a selection transistor including the selection gate insulating film and the selection gate electrode; and a control gate structure including the control gate insulating film and the control gate electrode.

The sensing gate insulating film and the control gate insulating film may have thicknesses equal or greater than a thickness of the selection gate insulating film.

In another general aspect, the method of manufacturing the semiconductor device includes: forming at least one gate oxidation acceleration ion implantation layer in a substrate where at least one non-volatile memory (NVM) gate insulating film to be formed; simultaneously forming a logic gate insulating film on a logic region and the at least one NVM gate insulating film on a non-volatile memory region, such that a thickness of the at least one NVM gate insulating film is equal or greater than a thickness of the logic gate insulating film; and forming a logic gate electrode on the logic gate insulating film and at least one NVM gate electrode on the at least one NVM gate insulating film.

The at least one gate oxidation acceleration ion implantation layer may include a dopant selected from the group consisting of fluorine, phosphorous, and arsenic.

The at least one NVM gate insulating film may include at least one of: a sensing gate insulating film; a selection gate insulating film; and a control gate insulating film.

The at least one NVM gate electrode may include at least one of: a sensing gate electrode disposed on the sensing gate insulating film; a selection gate electrode disposed on the select gate insulating film; and a control gate electrode disposed on the control gate insulating film, wherein the sensing gate electrode and the selection gate are connected with each other.

The sensing gate insulating film may be thicker than the logic gate insulating film.

The method may further include forming at least one well region in the substrate after the simultaneously forming the logic gate insulating film on the logic region and the at least one NVM gate insulating film on the non-volatile memory region.

The sensing gate insulating film may have a thickness greater than a thickness of the selection gate insulating film.

The selection gate insulating film may have a same thickness as a thickness of the logic gate insulating film.

The semiconductor device further include: a sensing transistor including the sensing gate insulating film and the sensing gate electrode; a selection transistor including the selection gate insulating film and the selection gate electrode; and a control gate structure including the control gate insulating film and the control gate electrode.

The sensing gate insulating film and the control gate insulating film may have thicknesses equal or greater than a thickness of the selection gate insulating film.

Other features and aspects will be apparent from the following detailed description, the drawings, and the claims.

BRIEF DESCRIPTION OF THE DRAWINGS

FIGS. 2A to 2E are manufacturing methods of the semiconductor device in accordance with one or more embodiments of the disclosure.

FIGS. 10A to 10G manufacturing methods of the non-volatile device in accordance with one or more embodiments of the disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
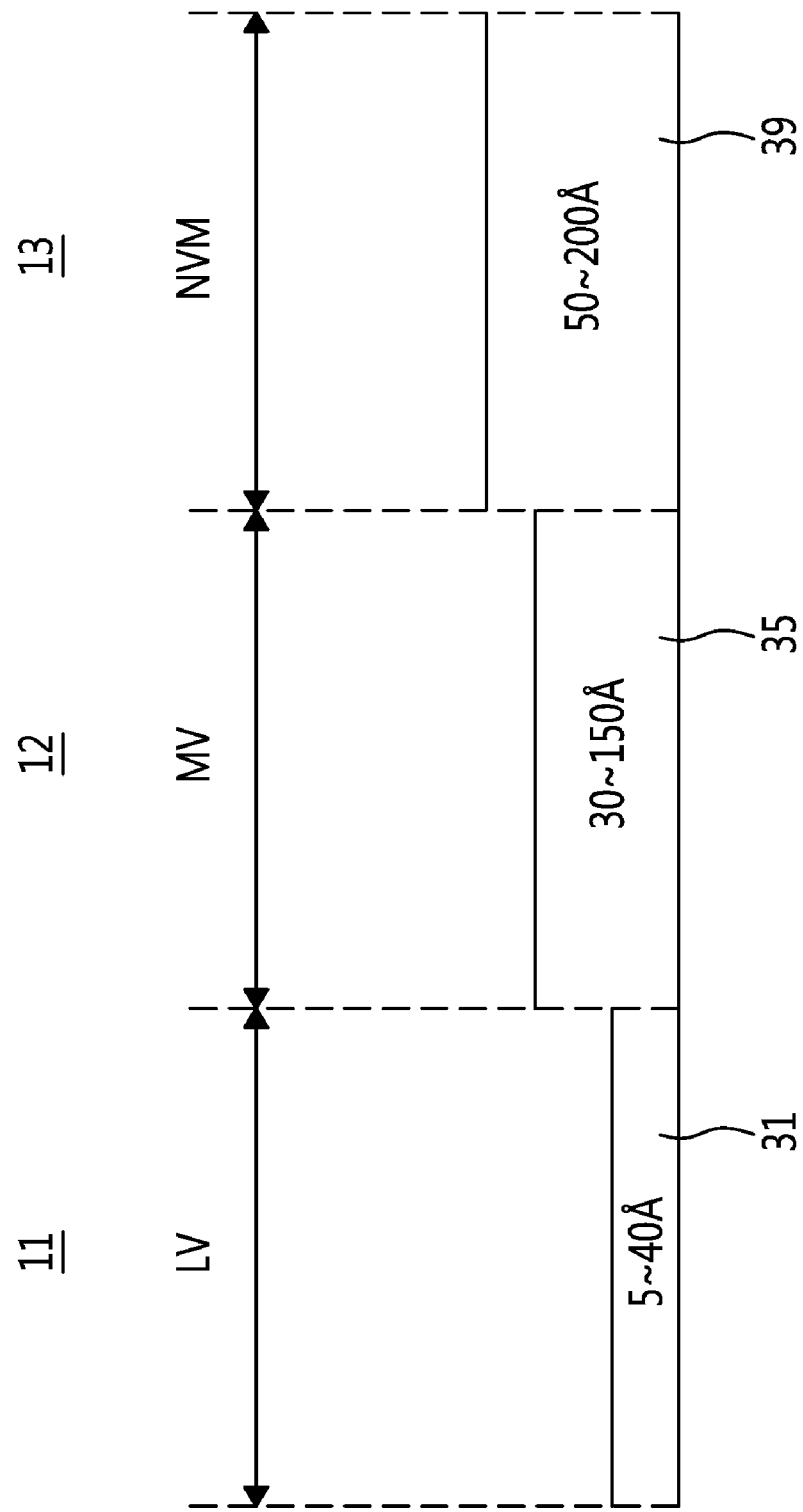
FIG. 1 is a cross-sectional view of the gate insulating film of the semiconductor device in accordance with one or more embodiments of the disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The disclosure is for a manufacturing method of a non-volatile memory device to solve problems of a conventional art. The disclosure is to form a sensing gate insulating film, a selection gate insulating film, and a control gate insulating film with various thicknesses and low costs in an NVM device by using an ion implantation process for increasing a thickness of a gate insulating film.

FIG. 1 is a cross-sectional view of the gate insulating film of the semiconductor device in accordance with one or more embodiments of the disclosure.

Referring to FIG. 1, the semiconductor device may include a low voltage (LV) region 11, a medium voltage (MV) region 12, and a non-volatile memory (NVM) region 13. A first to third gate insulating films 31, 35 and 39 may be formed in the LV region 11, the MV region 12, and the NVM region 13, respectively. Additionally, a first to third semiconductor devices (not shown) may be formed in the LV region 11, the MV region 12, and the NVM region 13, respectively. The first to third semiconductor devices may be referred to as a low voltage device, a medium voltage device, and a non-volatile memory device, respectively, according to an operating voltage.

The low voltage (LV) device or the medium voltage (MV) device may be implemented to form a SRAM, a standard cell, a logic device, a digital device, or an analog device. The LV region 11 and the MV region 12 may be referred to as a SRAM region, a standard cell region, a logic region, a digital region, or an analog region. Therefore, the first and second gate insulating films 31 and 35 are referred to as logic gate insulating films.

The non-volatile memory device may be one of an electrically programmable read only memory (EPROM), an electrically erasable programmable read only memory (EEPROM), a flash memory, a multiple time programmable (MTP) memory device, or a one-time programmable (OTP) memory device. Herein, the multiple time programmable (MTP) memory device may be a single poly multi-time programmable memory device. Therefore, the third gate insulating film 39 is referred to as NVM gate insulating films.

Therefore, in a large perspective, the SRAM device, the standard cell device, the logic device, the digital device, or the analog device may be formed in the LV region 11 and the MV region 12. On the other hand, a memory device may be formed in the NVM region 13.

An operating voltage of the LV region 11 may be 1-3V. An operating voltage of the MV region 12 may be 2-10V. An operating voltage of the NVM region 13 may be 2-15V.

Meanwhile, the MV region 12 and the NVM region 13 may have a similar operating voltage. Therefore, there may be many cases that gate insulating films of the MV region 12 and the NVM region 13 have a similar thickness.

In the LV region 11, a thickness of the first gate insulating film 31 may be 5 Å to 40 Å. A thickness of the second gate insulating film 35 in the MV region 12 may be 30 Å to 150 Å. A thickness of the third gate insulating film 39 in the non-volatile memory region 13 may be 50 Å to 200 Å. The third gate insulating film 39 of the non-volatile memory region 13 may be at least thicker than the second gate insulating film 35 in the MV region 12.

The third gate insulating film 39 of the non-volatile memory region 13 and the second gate insulating film 35 of the MV region 12 can be simultaneously formed. Although it is not shown, a fluorine (F) ion implantation process may be performed by opening the NVM region only. After the fluorine ion implantation process, an oxidation process may be performed. As another example, arsenic (As), argon (Ar), phosphorus (P), boron (B), or germanium (Ge) ion may be implanted into the substrate, instead of F ions. In the MV region 12, where the F ion implantation process is not performed, a thickness of the second gate insulating film 35 may be 30 Å to 150 Å, while a thickness of the third gate insulating film 39 in the non-volatile memory region 13, where the fluorine ion implantation process is performed, may be 50 Å to 200 Å, which is thicker than the thickness of the second gate insulating film 35. Related descriptions will be shown later for FIG. 2A, FIG. 2B, FIG. 2C, FIG. 2D, and FIG. 3.

FIGS. 2A to 2E are manufacturing methods of the semiconductor device including the non-volatile memory device in accordance with one or more embodiments of the disclosure.

Figure 2B:
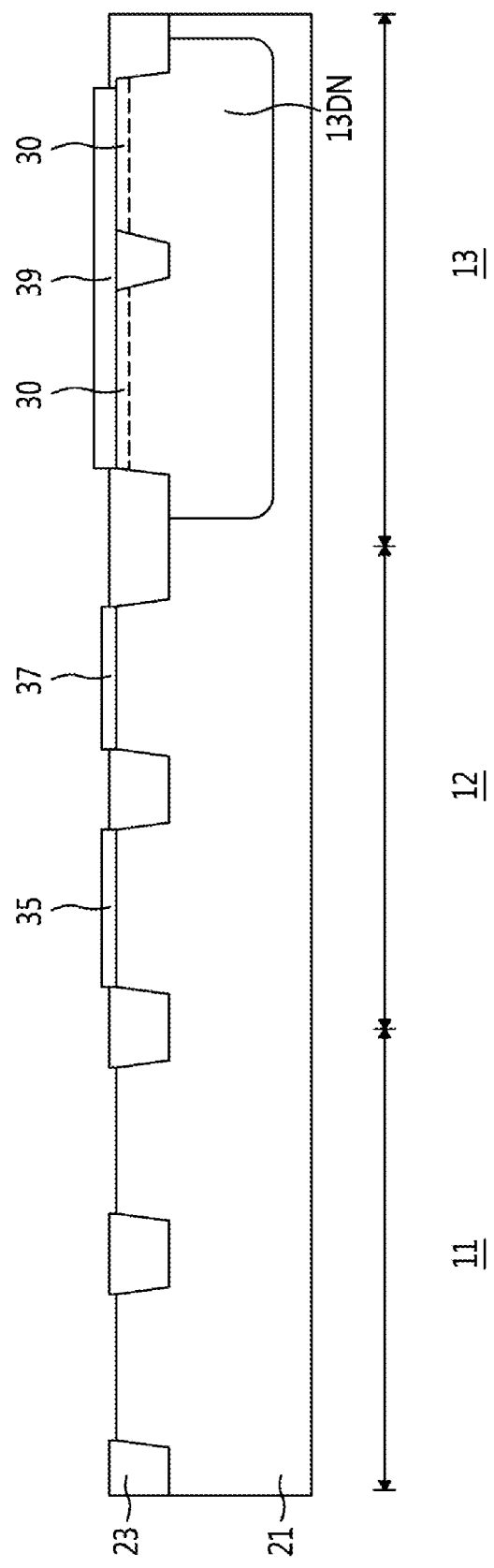

Referring to FIG. 2A, a DNW region 13DN may be formed in the NMV region or NVM region 13 of a substrate 21. Then, a mask pattern 25 may be formed. The mask pattern 25 may cover the LV region 11 and the MV region 12. In another example, the mask pattern 25 may be extended to cover a portion of the NVM region 13 (See FIG. 10A). The NVM region 13 may be opened, and an ion implantation process 27 with fluorine (F) ions may be performed to form a gate oxidation acceleration ion implantation layer 30 on the substrate 21. Before performing the ion implantation process 27, a screen insulating film 29 may be formed on a top surface of the substrate 21 to minimize a surface damage during the implantation process 27. The screen insulating film 29 may be removed after the ion implantation process. Otherwise, the ion implantation process 27 may be conducted without the screen insulating film 29. In another example, arsenic, argon, phosphorus (P), or boron (B) ions may be used for the gate oxidation acceleration ion implantation layer 30 on the substrate 21. Therefore, the gate oxidation acceleration ion implantation layer 30 may be formed only in the NVM region 13. The gate oxidation acceleration ion implantation layer 30 on the substrate 21 may accelerate a gate oxidation rate, thereby increasing a thickness of the gate insulating film. After the ion implantation process 27, the mask pattern 25 may be removed and then a thermal oxidation process (not shown) may be performed to form gate insulating films on the substrate 21 with LV region 11, the MV region 12 and the NVM region 13, respectively. The gate insulating film formed on the LV region 11 may be selectively removed by wet etching process (not shown). Therefore, the gate insulating films 35, 37 and 39 may be remained on the MV region 12 and NVM region 13, as shown in FIG. 2B.

Referring to FIG. 2B, second gate insulating films 35 and 37 may be formed on the MV region 12. The second gate insulating films 35 and 37 are referred to as logic gate insulating films. A third gate insulating film 39 may be formed on the NVM region 13. The third gate insulating film 39 may be referred to as the NVM gate insulating film 39. Therefore, in the MV region 12 and the NVM region 13, the logic gate insulating films 35 and 37 and the NVM gate insulating film 39 may be formed with having different thicknesses, respectively. Since the logic gate insulating films 35 and 37 and the NVM gate insulating film 39 may be formed simultaneously in the same operation, process costs may be considerably reduced because the number of masks may be reduced. The cost may increase considerably when additional mask is implemented to form the NVM gate insulating film 39. As described, when operating voltages of the MV region 12 and the NVM region 13 are similar and they need different thicknesses, it may be beneficial to form gate insulating films simultaneously to reduce process costs. The NVM gate insulating film 39 may be thicker than logic gate insulating films 35 and 37 because the F ions are implanted only in the NVM region 13. When an oxidation process is performed after implanting fluorine (F), arsenic (As), phosphorus (P), boron (B), or germanium (Ge) ion, an oxidation rate may become greater over 3 times, and therefore, a thicker gate insulating film may be formed.

Figure 2C:
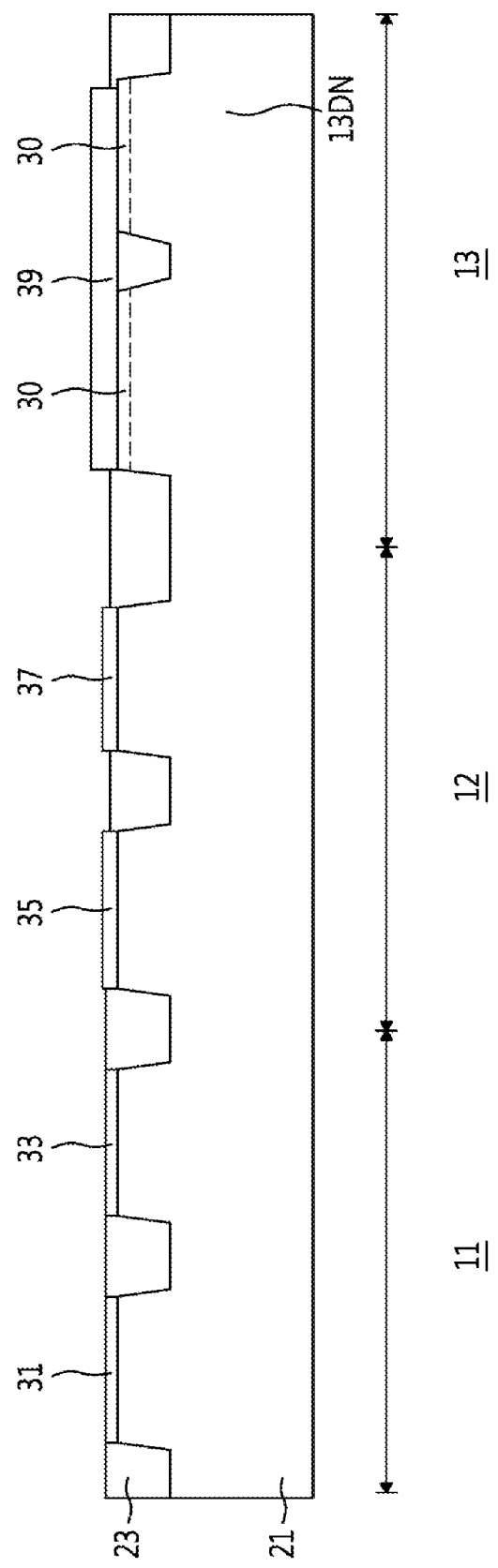

Referring to FIG. 2C, first gate insulating films 31 and 33 may be formed on the LV region 11. The first gate insulating films 31 and 33 may be referred to as thin gate insulating films. After the forming the thin gate insulating films 31 and 33, thicknesses of the logic gate insulating films 35 and 37 and the NVM gate insulating film 39 may be additionally increased. Therefore, the thin gate insulating films 31 and 33, the logic gate insulating films 35 and 37, and the NVM gate insulating film 39 may be formed on the LV, MV and NVM regions, respectively.

Figure 2D:
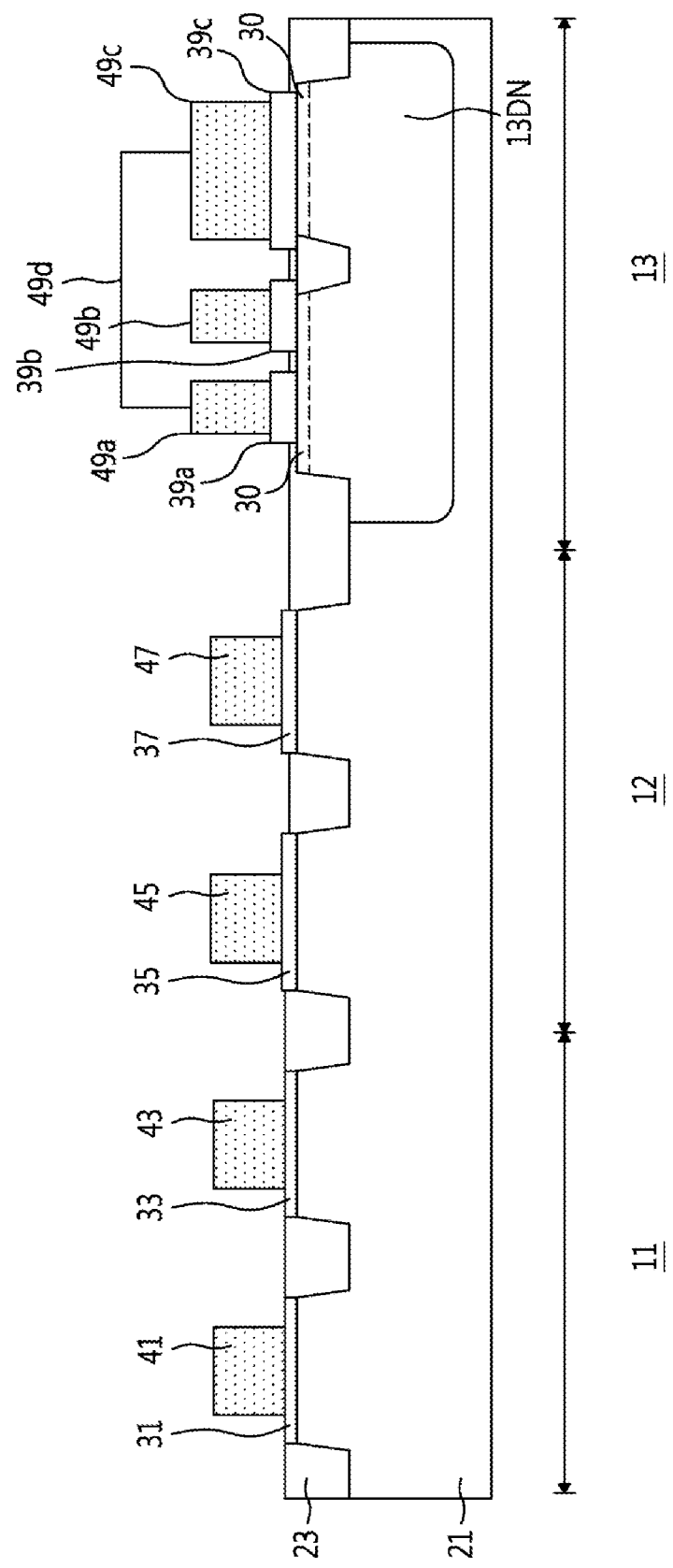

Referring to FIG. 2D, in the LV region 11, first gate electrodes 41 and 43 are formed on the thin gate insulating films 31 and 33, respectively. In the MV region 12, second gate electrodes 45 and 47 are further formed on the logic gate insulating films 35 and 37, respectively. In the NVM region 13, first to third NVM gate electrodes 49a, 49b and 49c are further formed on first to third NVM gate insulating films 39a, 39b and 39c, respectively, wherein the NVM gate insulating films 39a, 39b and 39c may be formed with spaced from each other.

FIG. 2D further illustrates an example that the first to third NVM gate insulating films 39a, 39b and 39c are formed to have the same thickness under the first to third NVM gate electrodes 49a, 49b and 49c, respectively. The first NVM gate electrode 49a and the third NVM gate electrode 49c may be connected to each other electrically through a floating gate electrode 49d. However, the second NVM gate electrode 49b may not be connected to the floating gate electrode 49d.

Figure 2E:
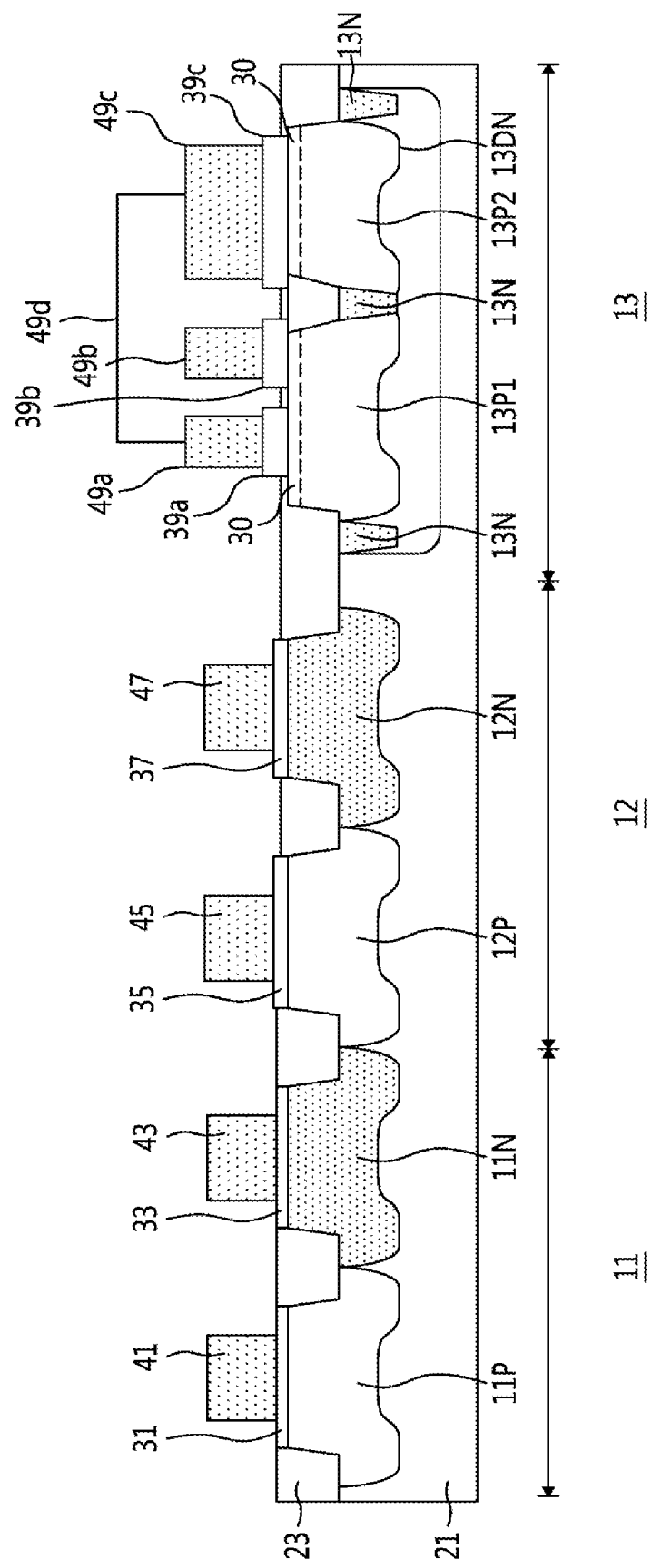

FIG. 2E illustrates a process of forming a plurality of well regions after forming gate electrodes. A first P-type well region (PW) 11P and a first N-type well region (NW) 11N may be formed in the LV region 11. A second P-type well region (PW) 12P and a second N-type well region (NW) 12N may be formed in the MV region 12. A plurality of P-type well regions (PWs) 13P1 and 13P2 may be formed additionally inside the N-type deep well region (DNW) 13DN in the NVM region 13. An NW 13N may be formed between PWs 13P1 and 13P2 for an isolation. The DNW region 13DN may have a depth greater than depths of the well regions including PW 11P, NW 11N, PW 12P, NW 12N, PW 13P1, 13P2, and NW 13N. Since the well regions including PW 11P, NW 11N, PW 12P, NW 12N, PW 13P1, 13P2, and NW 13N are formed by implementing through the gate electrode, a bottom depth may be curved, not flat. Each of the well regions including PW 11P, NW 11N, PW 12P, NW 12N, PW 13P1, 13P2, and NW 13N, which are overlapped with the gate electrodes, may have a depth less than depths of other regions that are not overlapped with the gate electrodes with respect to a top surface of the substrate 21.

In another example, after the well regions including the PW 11P, NW 11N, PW 12P, NW 12N, PW 13P1, 13P2, and NW 13N, etc., are formed, and then gate electrodes may be formed. In that example, the well regions including the PW 11P, NW 11N, PW 12P, NW 12N, PW 13P1, PW 13P2, and NW 13N, each may have coplanar bottom depth.

Figure 3:
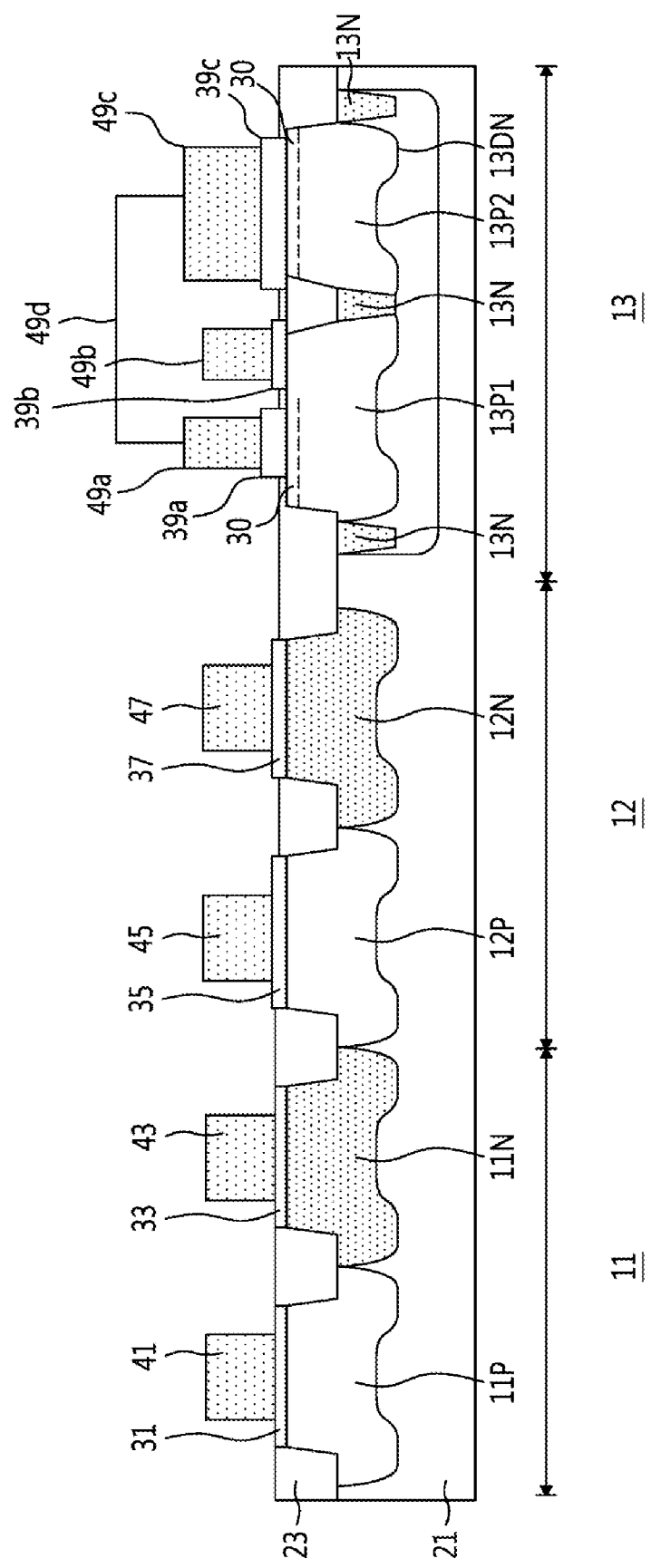
FIG. 3 is a cross-sectional view of the semiconductor device in accordance with another or more embodiments of the disclosure.

FIG. 3 is a cross-sectional view of the semiconductor device in accordance with another or more embodiments of the disclosure.

Referring to FIG. 3, it has a similar structure with FIG. 2E. However, each of the first to third NVM gate insulating films 39a, 39b and 39c disposed under the first to third NVM gate electrodes 49a, 49b and 49c, respectively, may have a different thickness. The second NVM gate insulating film 39b may have a thickness less than thicknesses of the first and third NVM gate insulating films 49a and 49c. It is possible that various thickness may be formed on the substrate 21 by implementing a selective ion implantation with fluorine atoms. For example, the selective ion implantation may be performed with the mask pattern 25. A region where the second NVM gate insulating film 39b to be formed may be covered with the mask pattern 25 to block the fluorine ion implantation (not shown).

Figure 6:
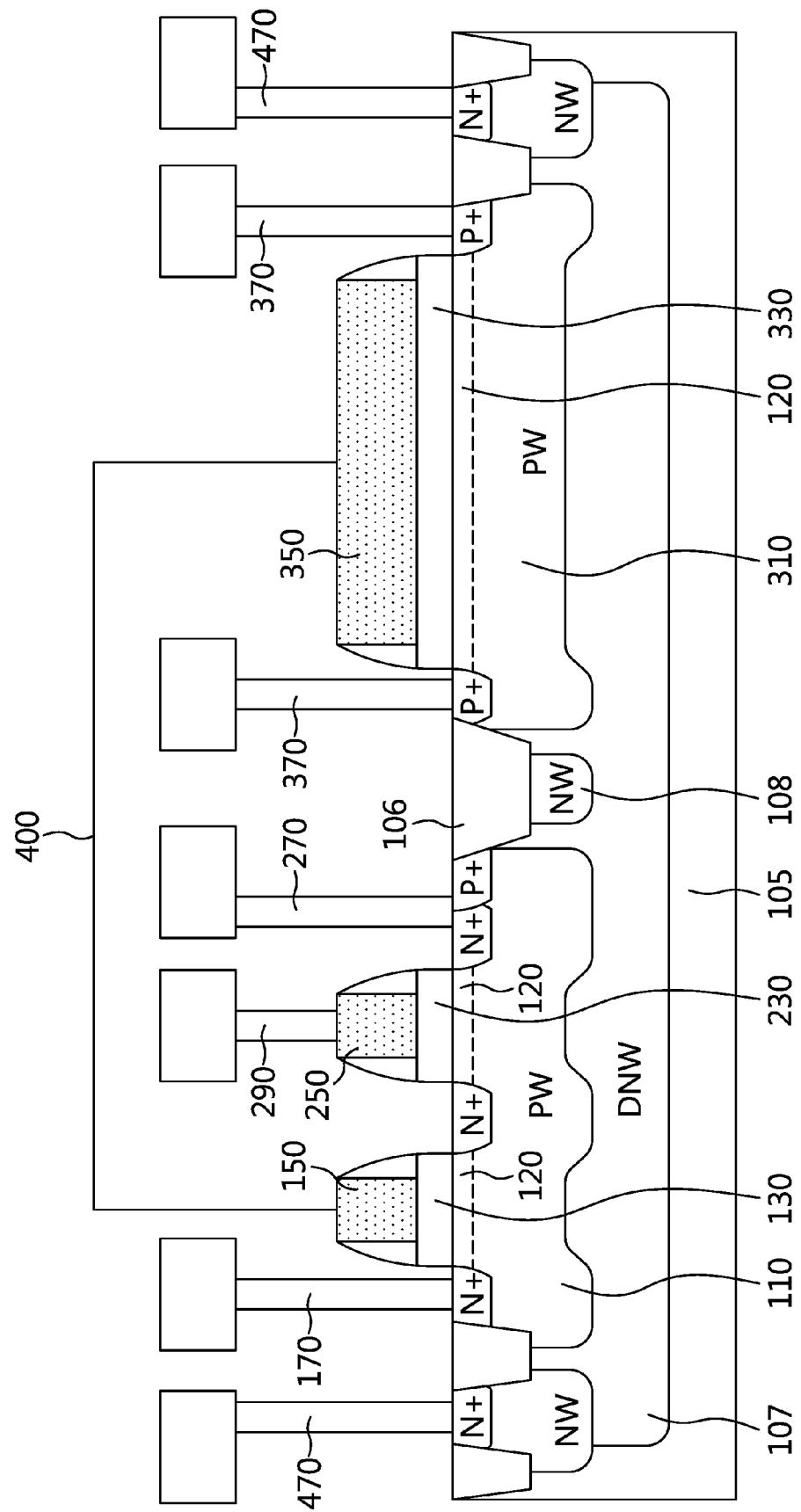
FIGS. 6 and 7 are cross-sectional views of the non-volatile memory device in accordance with one or more embodiments of the disclosure.
Figure 7:
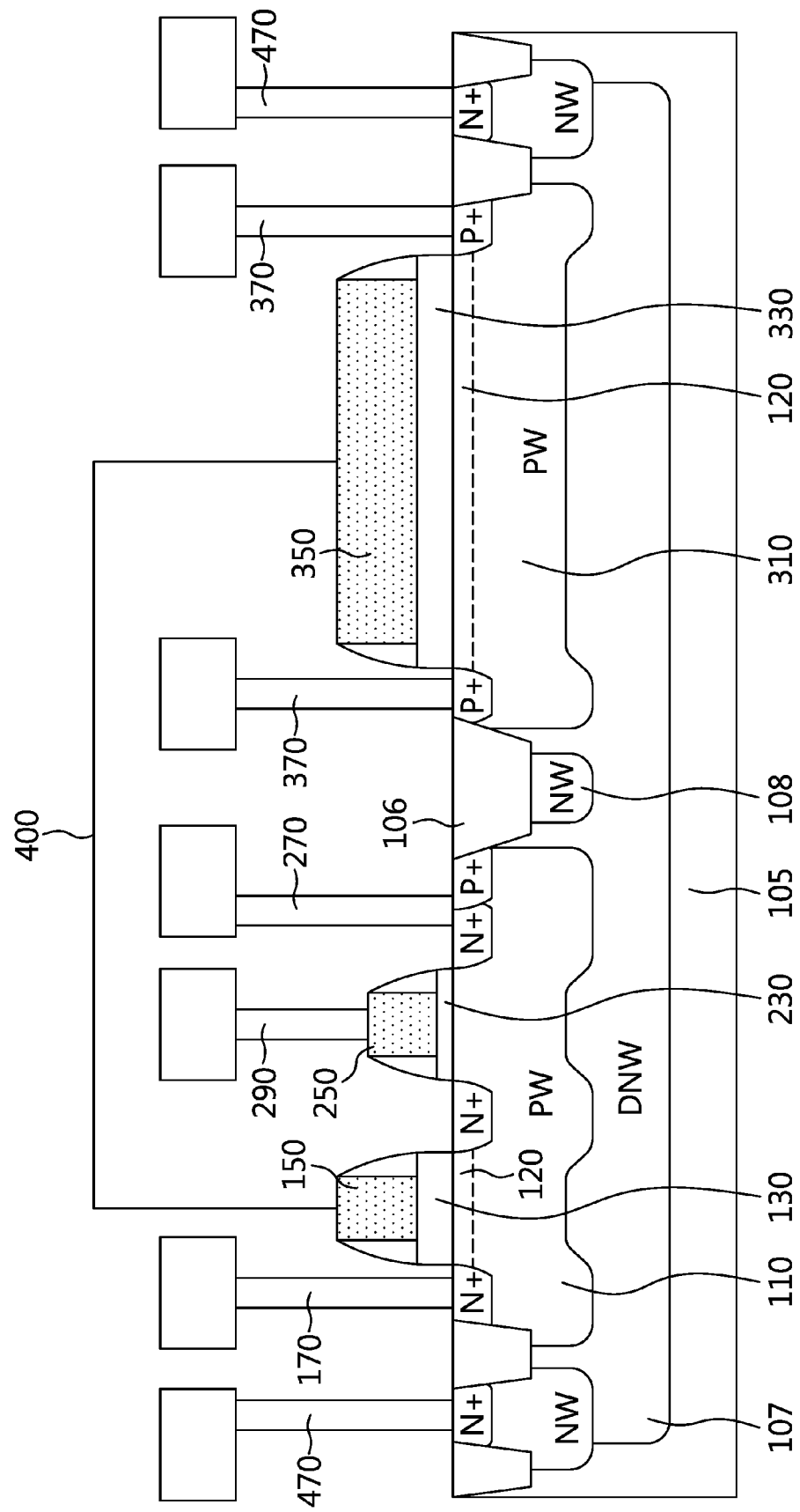

The first and third NVM gate electrodes 49a and 49c may be connected to each other electrically through the floating gate electrode 49d. The second NVM gate electrode 49b may not be connected to the floating gate electrode 49d. The second NVM gate insulating film 39b formed under the second NVM gate electrode 49b may be thinner than the first and the third NVM gate insulating film 39a and 39c. In other words, each of the first and third NVM gate insulating films 39a and 39c under the floating gate electrode 49d, may have a thickness greater than a thickness of the second gate insulating film 39b under the second NVM gate electrode 49b, which is not connected to the floating gate electrode 49d. Detailed descriptions for the first to third gate insulating films 39a, 39b and 39c are shown in FIG. 6 or FIG. 7.

Figure 4:
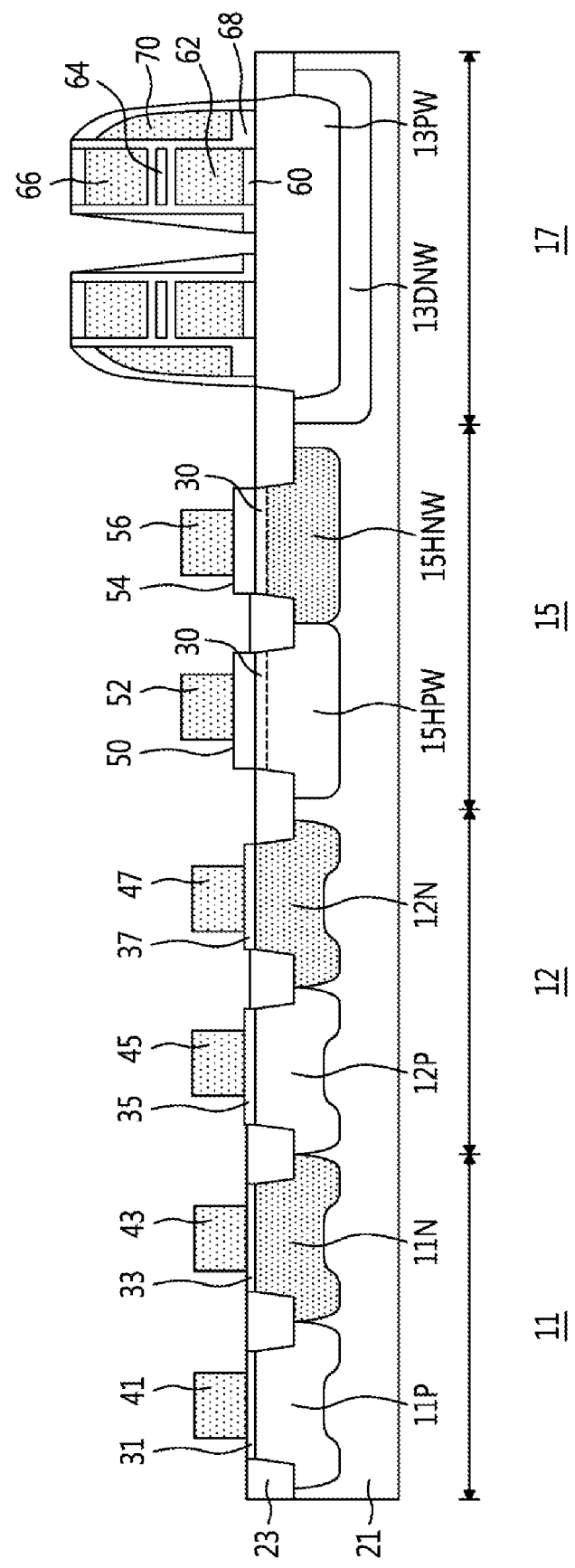
FIG. 4 is a cross-sectional view of the semiconductor device in accordance with another or more embodiments of the disclosure.

FIG. 4 is a cross-sectional view of the semiconductor device in accordance with another or more embodiments of the disclosure.

A LV device and MV device may be formed in the LV region 11 and the MV region 12, respectively. Descriptions for the LV device and MV device are identified above, so the descriptions are omitted. A high voltage (HV) driving device may be formed in a driving device region 15 to drive an NVM device. The HV driving device may be formed on a high voltage P-type well region (in short, HPW) 15HPW and a high voltage N-type well region (in short, HNW) 15HNW, respectively. Thicknesses of gate insulating films 50 and 54 of the HV driving device may be greater than those of logic gate insulating films 35 and 37. The HV driving device may include a thicker gate insulating film than that of the MV device to be operated in a higher voltage. To reduce process costs, the disclosure may form the ion implantation layer 30 to increase a thickness of a gate insulating film. The ion implantation layer 30 to increase the thickness of the gate insulating film may be formed by implanting ion into the substrate 21 by using a dopant such as fluorine (F), arsenic, argon, phosphorus, or boron, etc. Therefore, the logic gate insulating films 35 and 37 and the gate insulating films 50 and 54 of the HV driving device may be formed simultaneously. Since the dopants are ion-implanted into the driving device region 15 for acceleration of the gate oxide growth rate, the gate insulating films 50 and 54 of the HV driving device may have greater thickness than thicknesses of the logic gate insulating films 35 and 37.

Referring to FIG. 4, an NVM device may be further formed in the NVM region 17. A tunneling gate insulating film 60, a floating gate 62, a dielectric film 64, a control gate 66, a selection gate insulating film 68 and a selection gate 70 may be formed on an N-type deep well region 13DNW and a P-type well region 13PW, respectively.

Figure 5:
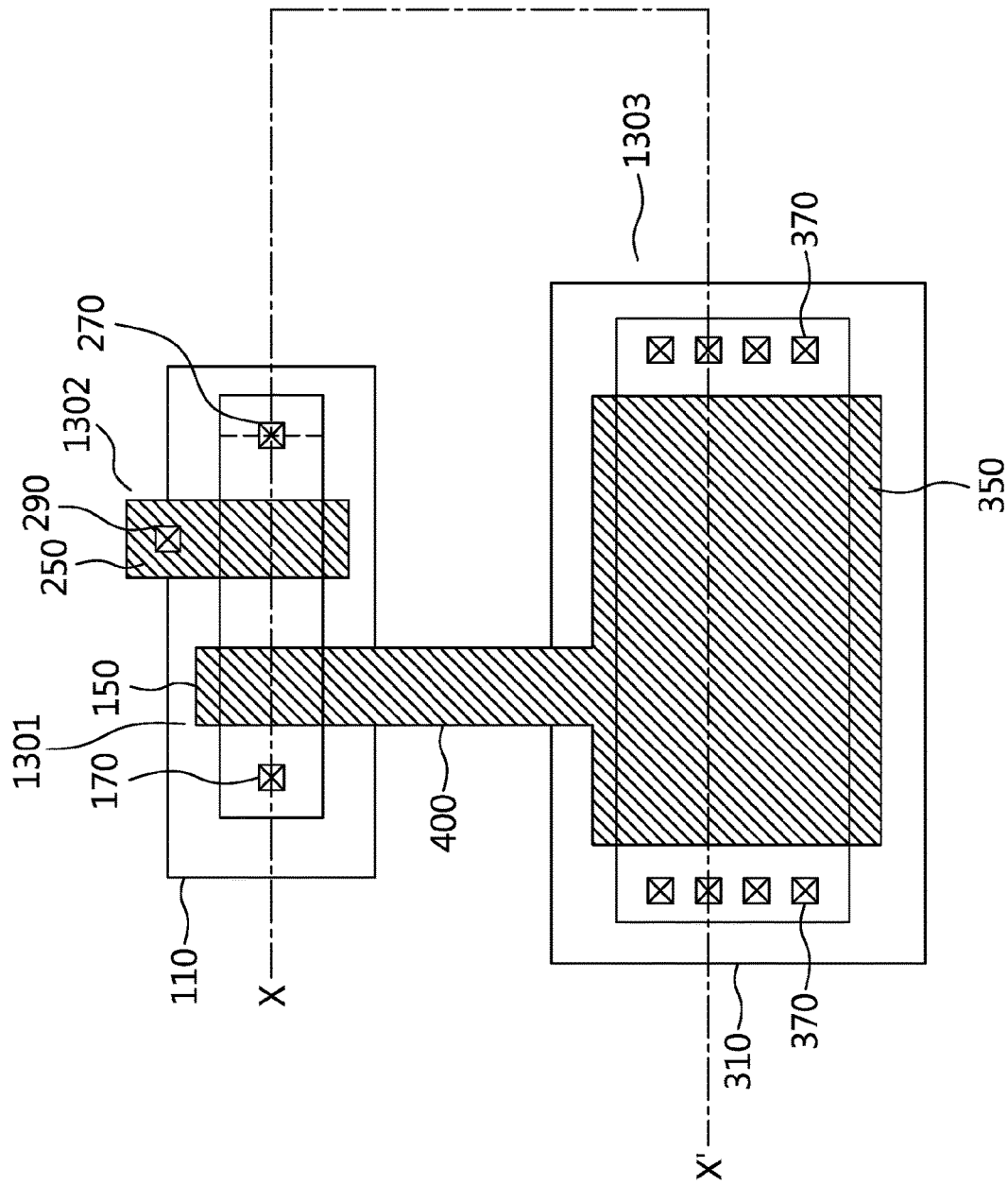
FIG. 5 is a plan view of the non-volatile memory device in accordance with one or more embodiments of the disclosure.

FIG. 5 is a plan view of the non-volatile memory device in accordance with one or more embodiments of the disclosure.

Referring to FIG. 5, the non-volatile memory device may include a sensing transistor 1301, a selection transistor 1302, and a control gate structure 1303. The sensing transistor 1301 and the selection transistor 1302 may be formed in a first P-type well region 110.

The sensing transistor 1301 may include a sensing gate 150 and a first contact plug 170. Additionally, in order to apply a drain voltage or a bit line voltage ($V_{BL}$) to the first contact plug 170, a bit line (in short, BL) may be connected to first contact plug 170 of the sensing transistor 1301. Herein, the sensing gate 150 may be considered as a portion of a floating gate (FG) 400. The floating gate 400 may also be implemented to the control gate structure 1303. There is no connected contact plug on the floating gate (FG) 400.

The selection transistor 1302 may include a selection gate 250, a second contact plug 270, and a third contact plug 290. A source line (in short, SL) may be connected to the second contact plug 270. In order to apply a voltage to the selection gate 250, a selection gate line (SG line, in short, SG) may be connected to the third contact plug 290. Herein, the SG line may be referred to as a word line (in short, WL).

The control gate structure 1303 may include a fourth contact plug 370 and a control gate 350 formed in a second P-type well region 310. The fourth contact plug 370 formed in the second P-type well region 310 may be formed on opposite sides of the control gate 350. A control gate line (CG line, in short, CG) may be connected to the fourth contact plug 370.

The control gate 350 may be considered as a portion of the floating gate (FG) 400. The floating gate (FG) 400 may be formed with a single poly-Si layer. The control gate 350 is connected to the sensing gate 150 with the single poly-Si layer. The single Poly-Si layer is a conductive layer. Since there is no contact plug directly connected to the sensing gate 150 and the control gate 350, the sensing gate 150 and the control gate 350 may also be called as the floating gate (FG) 400. Therefore, electrons may be charged into or discharged from the floating gate electrode 400.

FIG. 5 illustrates a single poly multi-time programmable (MTP) memory cell including two transistors 1301 and 1302 and a control gate structure 1303. Herein, the two transistors 1301 and 1302 are the sensing transistor 1301 and the selection transistor 1302, respectively. Programming may be possible by charging or discharging electrons through the sensing transistor 1301. The sensing transistor 1301 may be called a program transistor. The bit line (BL) voltage ($V_{BL}$) may be applied to a drain terminal 170 of the sensing transistor 1301. A selection gate voltage ($V_{SG}$) and a source voltage ($V_{SL}$) may be applied to the gate terminal 290 and the source terminal 270 of the selection transistor 1302, respectively. The selection transistor 1302 may be turned on or turned off according to the selection gate voltage ($V_{SG}$) applied to the selection gate 250. The sensing transistor 1301 and the selection transistor 1302 may be formed in the first well region 110. The selection transistor 1302 may reduce an off-leakage current when the single poly MTP memory cell is over erased. The control gate structure 1303 may have a structure to control charging or discharging electrons to the control gate 350. A control gate voltage ($V_{CG}$) may be applied to the fourth contact plug 370 of the control gate structure 1303. The control gate structure 1303 may be formed on the second well region 310.

FIGS. 6 and 7 are cross-sectional views of the non-volatile memory device in accordance with one or more embodiments of the disclosure, along the line X-X' of FIG. 5.

Referring to FIG. 6, as mentioned above, the non-volatile memory device may include first to third NVM gate insulating films 130, 230 and 330. The first to third NVM gate insulating films 130, 230 and 330 may correspond to the above-identified NVM gate insulating films 39a, 39b, and 39c of FIG. 2. The non-volatile memory device may further include first to third NVM gate electrodes 150, 250 and 350 formed on the first to third NVM gate insulating films 130, 230 and 330, respectively. The first to third NVM gate electrodes 150, 250 and 350 may correspond to the first to third NVM gate electrodes 49a, 49b, and 49c of FIG. 2D or FIG. 3.

For convenience for descriptions, the first, the second, and the third NVM gate insulating films 130, 230 and 330 are now referred to as a sensing gate insulating film 130, a selection gate insulating film 230, and a control gate insulating film 330, respectively. For convenience for descriptions, the first, the second, and the third NVM gate electrodes 150, 250 and 350 are now referred to as a sensing gate 150, a selection gate 250, and a control gate 350, respectively. The sensing gate 150 may be referred to as a program gate.

The sensing gate insulating film 130 and the selection gate insulating film 230 may be formed on the first P-type well region 110. The control gate insulating film 330 may be formed on the second P-type well region 310. The control gate insulating film 330 may be considered as a dielectric film of the control gate structure 1303. The sensing gate 150, the selection gate 250, and the control gate 350 may be formed on the sensing gate insulating film 130, the selection gate insulating film 230, and the control gate insulating film 330, respectively. The sensing gate 150 and the control gate 350 may be connected to each other electrically and physically as portions of the floating gate 400. The sensing gate 150 and the control gate 350 may be gate electrodes manufactured by a single poly-Si layer.

The sensing gate insulating film 130, the selection gate insulating film 230, and the control gate insulating film 330 may have the same thickness. However, as described above, the NVM gate insulating films including the sensing gate insulating film 130, the selection gate insulating film 230, and the control gate insulating film 330, may have a thickness greater than a thickness of the logic gate insulating films 35 and 37 in the MV region. Due to the ion implantation layer 120 to increase a growth rate of the gate oxide layer, the NVM gate insulating films 130, 230 and 330 may become thicker than the logic gate insulating films 35 and 37. Dopants such as fluorine (F), argon (Ar), phosphorus (P), boron (B), or germanium (Ge) are implanted to form the ion implantation layer 120 before forming gate insulating films to increase the growth rate of the NVM gate insulating films on the substrate. Herein, when the sensing gate insulating film 130 becomes thicker, a data retention may be improved. Data retention refers to the ability of a memory bit to retain its data state over long periods of time regardless of whether the device is powered on or powered off. Due to the increased thickness of the NVM gate insulating films, electrons are stably stored in the floating gate (FG) 400. As the sensing gate insulating film 130 becomes thicker, the electrons may not be easily discharged from the FG 400.

The non-volatile memory device may include a plurality of shallow trenches 106 formed between the first P-type well region 110 and the second P-type well region 310. The non-volatile memory device may further include a plurality of N-type well regions (NW) 108. The N-type well region (NW) 108 formed on a bottom the shallow trench 106 may play a role of channel stop between adjacent devices. The non-volatile memory device may further include a deep well region (DNW) 107 surrounding the first P-type well region 110, the second P-type well region 310, and the N-type well region 108.

In a programming operation, a positive VPP may be applied to the fourth contact plug 370. Additionally, a negative VPP may be applied to the second contact plug 270. Then, electrons may be injected from the first PW 110 into the sensing gate 150 or the floating gate 400, resulting in the programming operation. A threshold voltage (Vt) of a single poly NVM 100 may increase. In contrast, in an erasing operation, a negative VPP may be applied to the fourth contact plug 370, and a positive VPP may be applied to the second contact plug 270. Then, electrons in the sensing gate 150 or floating gate 400 may be discharged to the first PW 110, resulting in the erasing operation.

Referring to FIG. 7, the structure of FIG. 7 is similar to FIG. 6 except that the sensing gate insulating film 130 and the control gate insulating film 330 are thicker than the selection gate insulating film 230. In order to increase thicknesses of the sensing gate insulating film 130 and the control gate insulating film 330, there may be the ion implantation layer 120 with fluorine, phosphorus, boron, or germanium, etc. under the sensing gate insulating film 130 and the control gate insulating film 330, respectively. In contrast, there may be no ion implantation layer 120 under the selection gate insulating film 230.

As described above, the logic gate insulating films 35 and 37, the sensing gate insulating film 130, the selection gate insulating film 230, and the control gate insulating film 330 may be formed simultaneously in one process. Also, the sensing gate insulating film 130 and the control gate insulating film 330, in which the ion implantation layer 120 is formed, may be thicker than the logic gate insulating films 35 and 37. On the other hand, the selection gate insulating film 230 and the logic gate insulating films 35 and 37, which do not include the ion implantation layer 120, may be thinner than the sensing gate insulating film 130 and the control gate insulating film 330. A thickness of the selection gate insulating film 230 is similar to thicknesses of the logic gate insulating films 35 and 37.

The thicker the sensing gate insulating film 130 and the control gate insulating film 330 become, a data retention ability of a MTP memory cell may be improved. Referring to FIG. 6 and FIG. 7, a thickness of the sensing gate insulating film 130 may be equal or greater than a thickness of the selection gate insulating film 230. Each of the sensing gate and control gate insulating films 130 and 330 formed under the floating gate 400, may have a thickness greater than a thickness of the selection gate insulating film 230, which is not formed under the floating gate 400.

Figure 8:
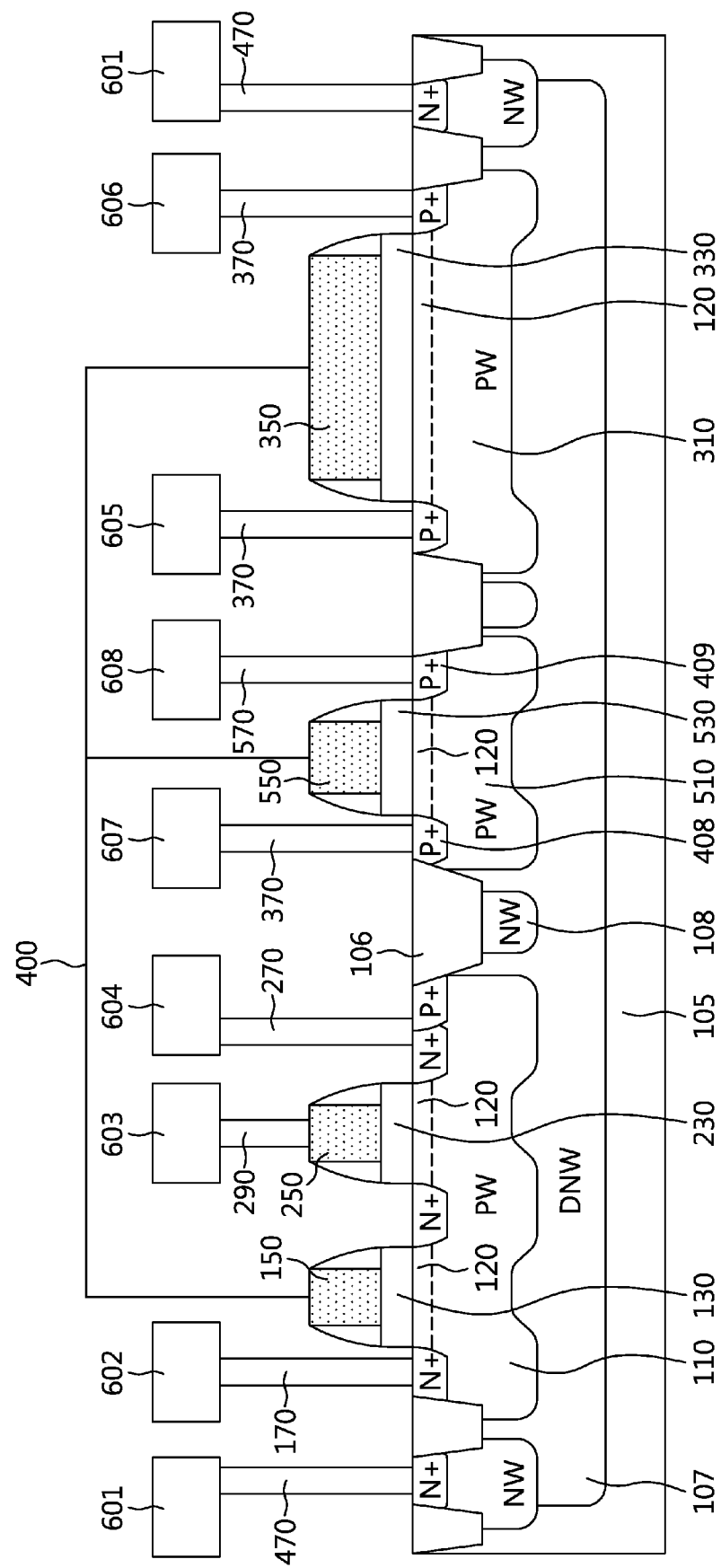
FIGS. 8 and 9 are cross-sectional views of the non-volatile memory device in accordance with another or more embodiments of the disclosure.
Figure 9:
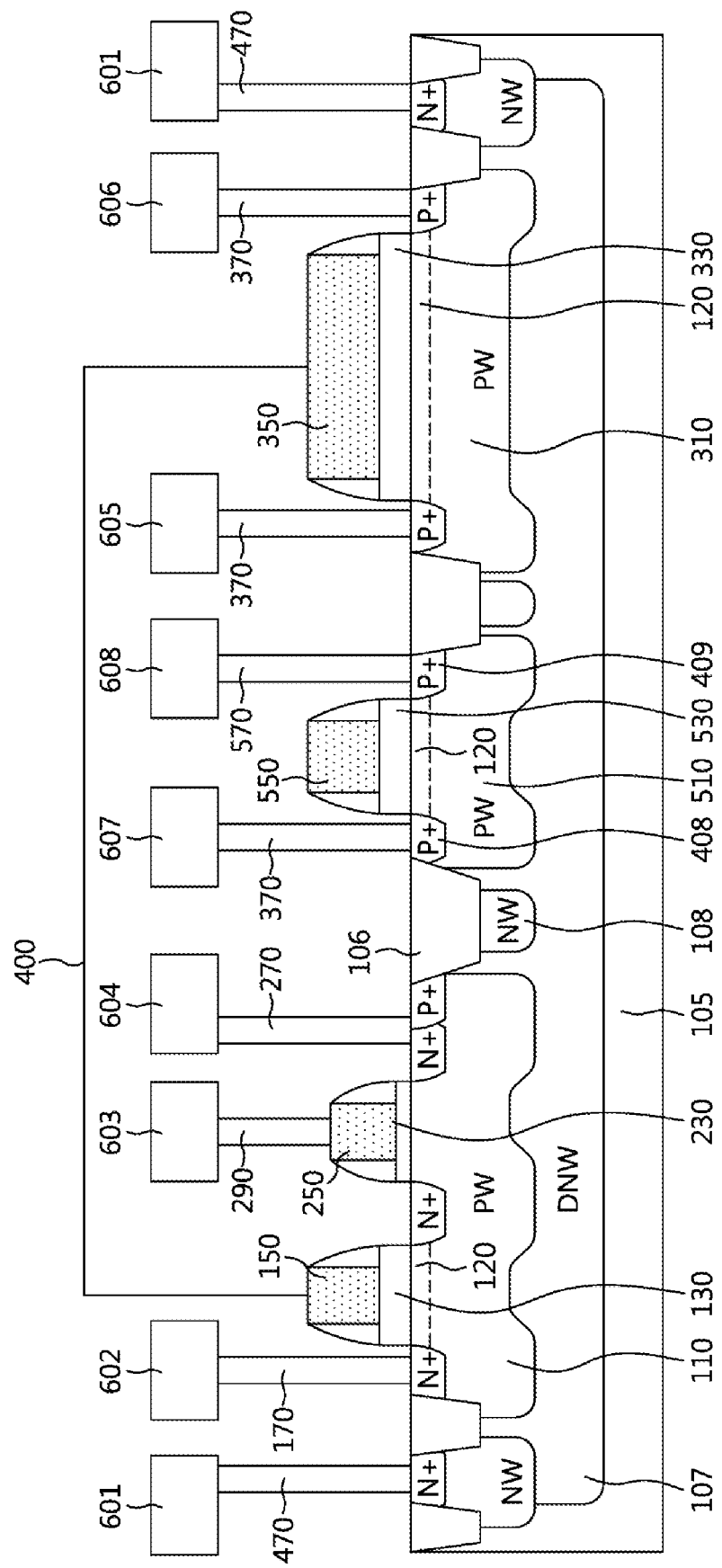

FIGS. 8 and 9 are cross-sectional views of the non-volatile memory device in accordance with another or more embodiments of the disclosure.

Referring to FIG. 8, the NVM gate insulating films may include the first, the second, the third, and a fourth NVM gate insulating films 130, 230, 330 and 530. The NVM gate electrodes may include the first, the second, the third, and a fourth NVM gate electrodes 150, 250, 350 and 550 that are formed on the first, the second, the third, and the fourth NVM gate insulating films 130, 230, 330 and 530, respectively. For convenience of descriptions, the first, the second, the third, and the fourth NVM gate insulating films 130, 230, 330 and 530 may be referred to as the sensing gate insulating film 130, the selection gate insulating film 230, the control gate insulating film 330, and an erase gate insulating film 530, respectively. For convenience of descriptions, the first, the second, the third, and the fourth NVM gate electrodes 150, 250 and 350, 550 may be referred to as the sensing gate 150, the selection gate 250, the control gate 350, and an erase gate 550, respectively. The sensing gate 150 may be referred to as a program gate electrode. Except for the selection gate 250, the sensing gate 150, the control gate 350, and the erase gate 550 may be connected to each other electrically. The sensing gate 150, the control gate 350, and the erase gate 550 may be connected to each other electrically by the floating gate electrode 400.

Thicknesses of the sensing gate insulating film 130, the selection gate insulating film 230, the control gate insulating film 330, and the erase gate insulating film 530 may be identical, or they may be thicker than thicknesses of the logic gate insulating films 35 and 37.

Referring to FIG. 9, the sensing gate insulating film 130, the control gate insulating film 330, or the erase gate insulating film 530 may be thicker than the selection gate insulating film 230. As described above, the sensing gate insulating film 130, the control gate insulating film 330, and the erase gate insulating film 530 may be thicker than the logic gate insulating films 35 and 37. On the other hand, a thickness of the selection gate insulating film 230 may be identical to a thickness of the logic gate insulating films 35 and 37.

The thicker the sensing gate insulating film 130 and the control gate insulating film 330 become, a data preserving capacity of a MTP memory cell, that is, a retention of a MTP memory cell may be improved. Since the selection gate insulating film 230 little affects the retention, it may have the same thickness with the logic gate insulating films 35 and 37.

The gate insulating films 130, 330, 530, which are formed under the sensing gate 150, the control gate 350, and the erase gate 550 connected to each other electrically, may be thicker than the selection gate insulating film 230. In other words, each of the sensing gate, control gate and erase gate insulating films 130, 330 and 530 formed under the floating gate 400, may have a thickness greater than a thickness of the selection gate insulating film 230, which is not formed under the floating gate 400.

FIGS. 10A to 10G illustrate manufacturing methods of the non-volatile device in accordance with one or more embodiments of the disclosure.

Figure 10A:
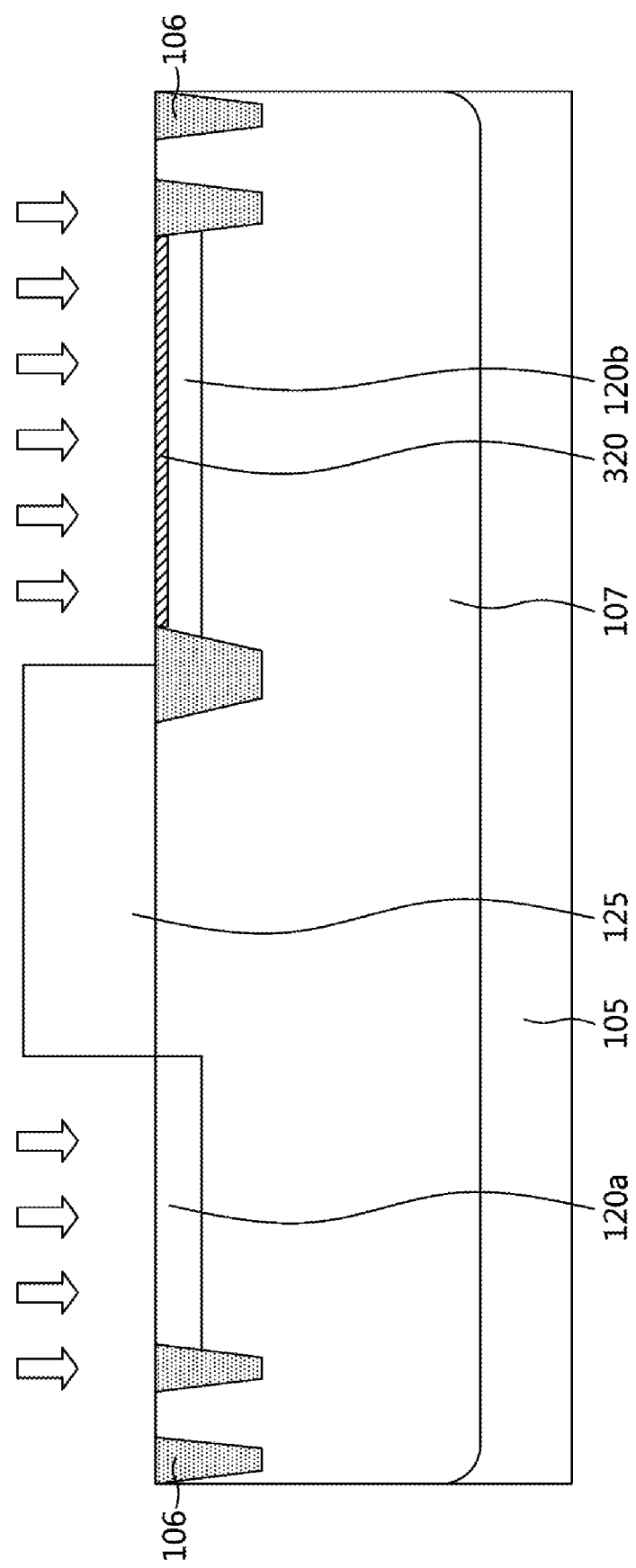

Referring to FIG. 10A, a plurality of device isolation films 106 may be formed on a semiconductor substrate 105. The device isolation film 106 may be formed using STI (Shallow Trench Isolation) or LOCOS (LOCal Oxidation of silicon). The DNW 107 may be formed on the substrate by performing an ion implantation. A control gate ion implantation region 320 may be further formed on the DNW 107 using boron (B) and indium (In) ions to increase a coupling ratio. The control gate ion implantation region 320 may be formed by sequentially implanting boron (B) and indium (In) ions or by implanting only one of boron (B) and indium (In) ions. A boron ion (11B+) implantation may be performed with 10-40 KeV ion implantation energy and $1.0E11$-$1.0E13/m^2$ dose. An Indium ion (115In+) implantation may be performed with 100-300 KeV and $1.0E11$-$1.0E13/cm_2$ dose.

Next step, a photoresist (PR) mask pattern 125 may be formed on the DNW 107 for accelerated oxidation ion implantation process. Fluorine (F) ion implantation may be performed to form first and second ion implantation regions 120a and 120b spaced from each other using the PR mask pattern 125. The F ion implantation may performed with $1E$-$12$-$1315$ atoms/cm² and 5-30 KeV energy. Arsenic (As) or phosphorus (P) ions may be used for accelerated oxidation ion implantation process, rather than the F ions. When a gate oxidation process is performed after implanting fluorine (F), arsenic (As) or phosphorus (P) ion, the gate oxidation may be accelerated with at least three times than a gate oxidation without those ions. Thus the fluorine (F), arsenic (As) or phosphorus (P) ions may be referred to as accelerated oxidation ions to increase a gate oxidation rate. The first and second ion implantation regions 120a and 120b may also be referred as accelerated oxidation ion implantation regions or layers 120a and 120b. Therefore, gate insulating films that is thicker than others may be formed on portions where the accelerated oxidation ion implantation layer 120a and 120b are disposed on. In the disclosure, F ions may be previously implanted into regions where the sensing gate insulating film 130 and the control gate insulating film 330 are formed. The mask pattern 125 may be removed afterwards.

Figure 10B:
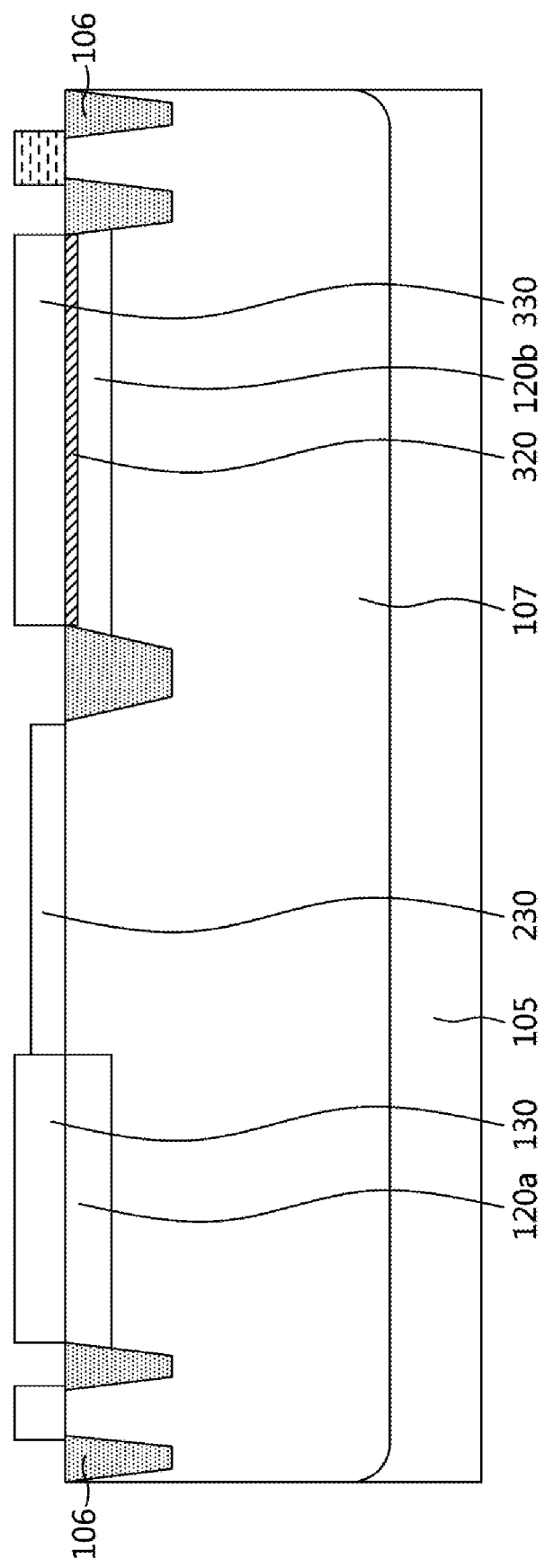

Referring to FIG. 10B, an oxidation process may be performed at a high temperature over 750° C. to form a gate insulating film. The sensing gate insulating film 130, the selection gate insulating film 230, and the control gate insulating film 330 may be formed simultaneously. The sensing gate insulating film 130 and the control gate insulating film 330 may have a thick thickness of 5~20 nm. The selection gate insulating film 230 may have a thickness of 3~15 nm. The sensing gate insulating film 130 and the control gate insulating film 330 may be thicker than the selection gate insulating film 230. The difference of thicknesses may be due to the fluorine ion implantation, as described above. Conventionally, several gate oxidation processes are required to obtain different target thicknesses of the gate insulating films. However, with the manufacturing method of the non-volatile device of the present disclosure, it is possible to obtain different gate insulating film thicknesses by performing one-step oxidation process with accelerated oxidation ion implantation process. Therefore, a gate oxidation process may be simplified.

Figure 10C:
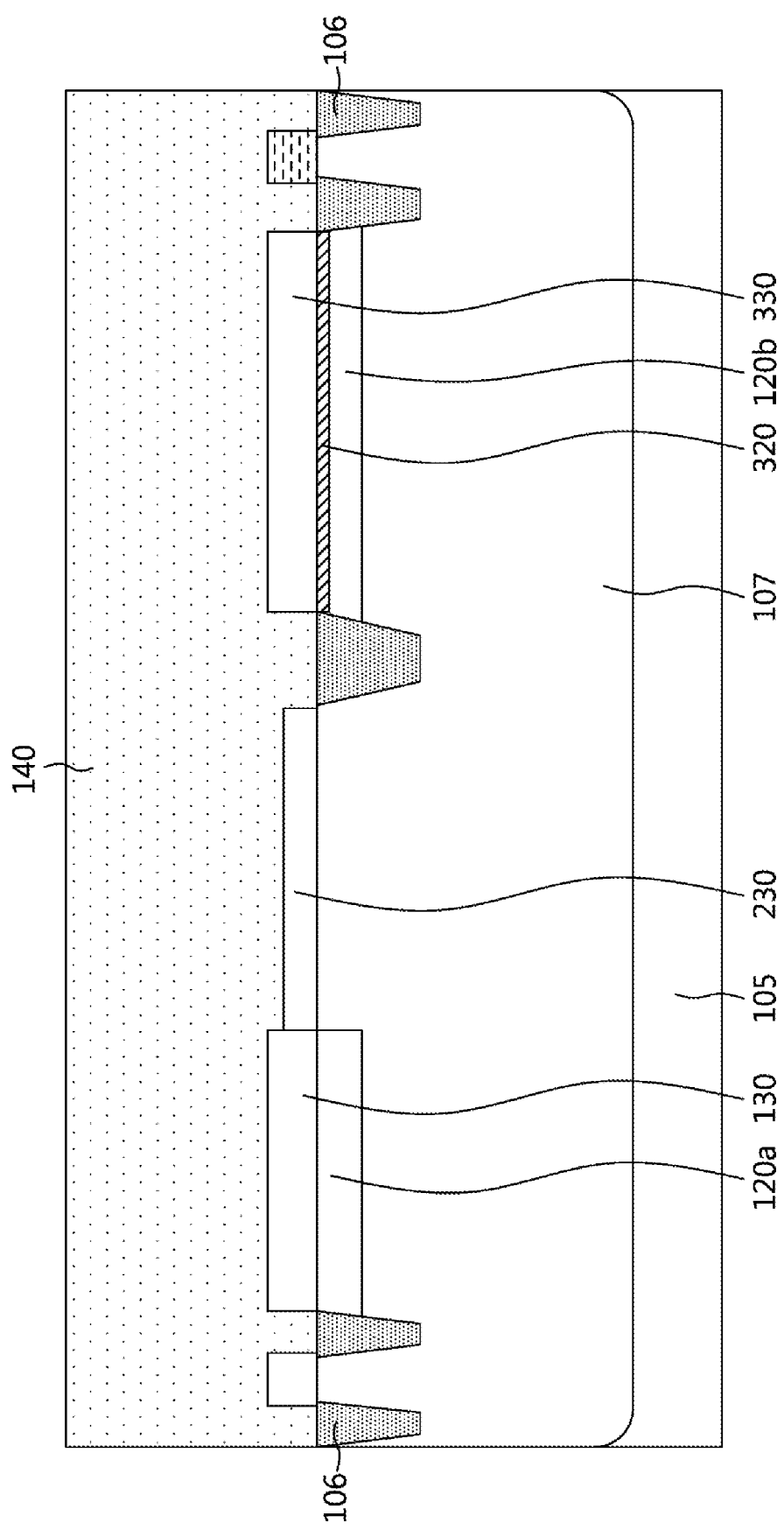

Referring to FIG. 10C, a thick conductive layer 140 may be formed to form gates. A poly-Si material may be implemented for the conductive layer 140. A poly-Si layer may be formed with undoped or doped amorphous silicon film. In one example, a doped amorphous silicon film may be formed by using $SiH_4$ or $Si_2H_6$ and $PH_3$ gas. An undoped amorphous silicon film may be formed by using $SiH_4$ or $Si2H_6$ gas.

Figure 10D:
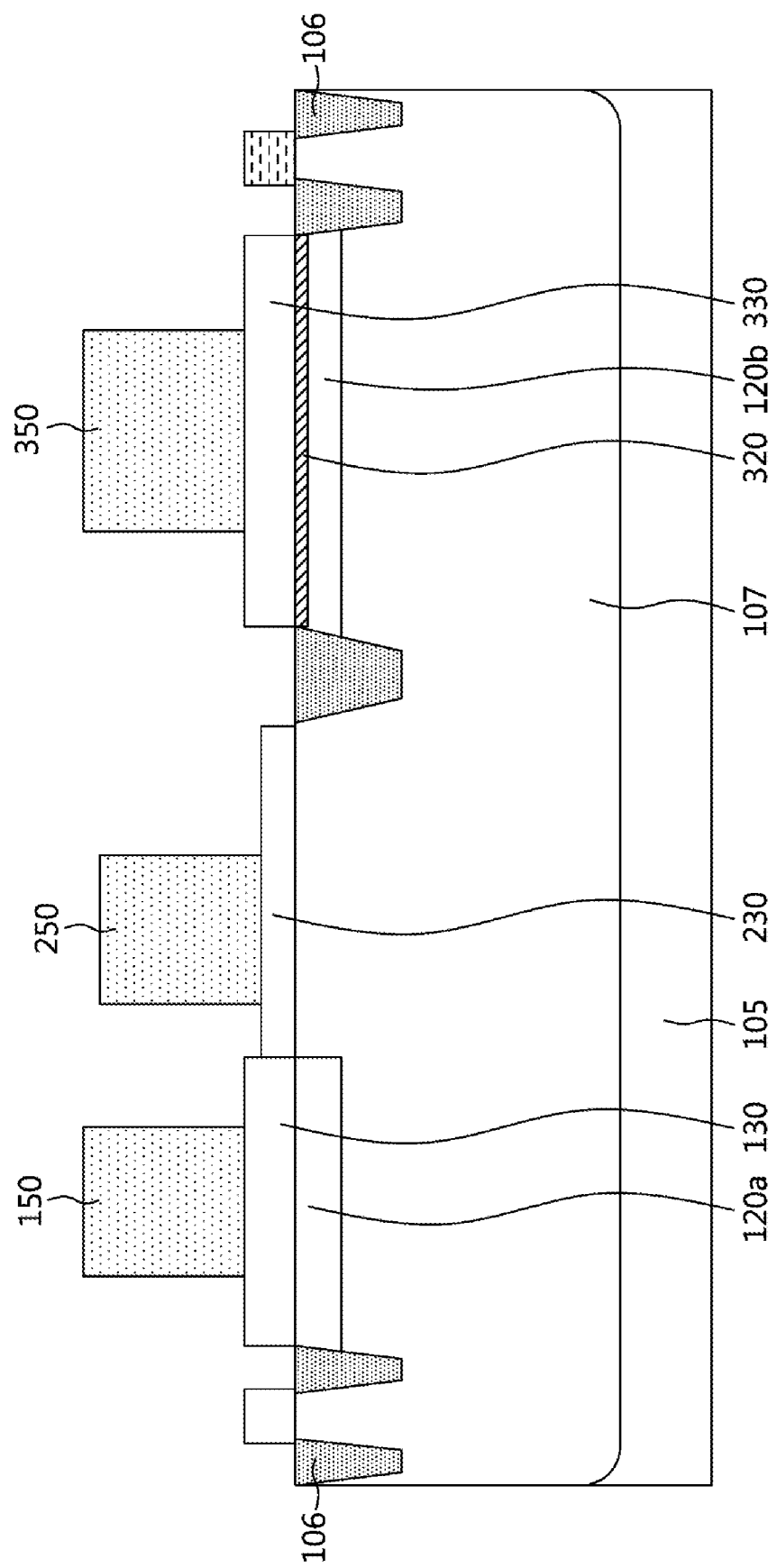

Referring to FIG. 10D, the conductive layer 140 may be patterned to form gates. The sensing gate 150, the selection gate 250, and the control gate 350 may be formed simultaneously on the sensing gate insulating film 130, the selection gate insulating film 230, and the control gate insulating film 330, respectively. The sensing gate 150 and the control gate 350 may be portions of the floating gate 400, and they may be connected to each other physically and electrically.

Figure 10E:
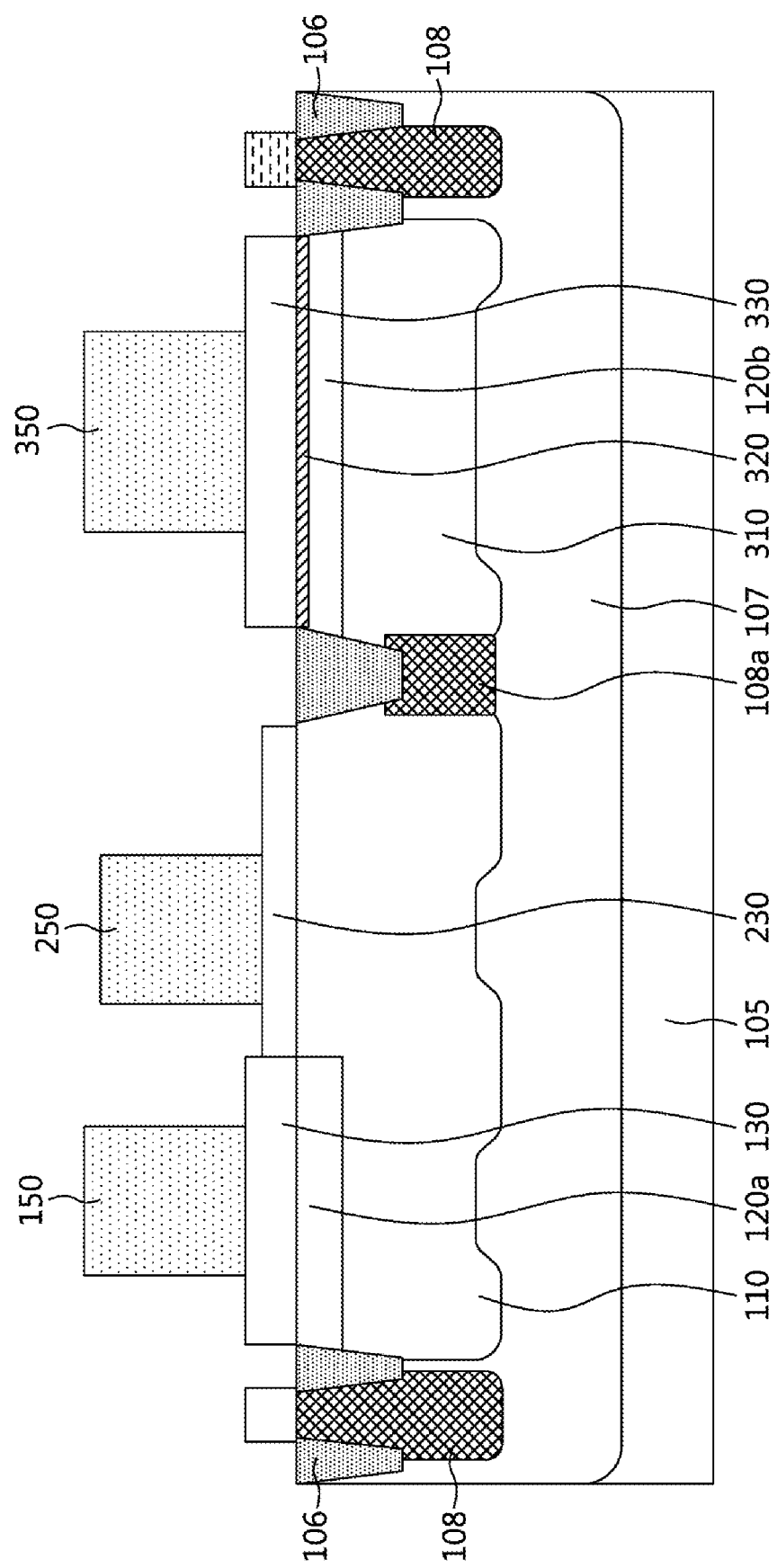

Referring to FIG. 10E, a plurality of well regions 110 and 310 may be formed after forming gates. Since the well regions 110 and 310 may be formed by performing an ion implantation with the gate electrode as a mask, depths of well regions 110 and 310 may be curved. Well regions 110 and 310 overlapped with the gate electrode may be relatively thin. However, well regions 110 and 310 that are not overlapped with the gate electrode may be relatively deep. Well regions 110 and 310 may be P-type. Although it is not shown, various N-type or P-type LDD regions may be formed.

Although it is not shown, as another example, the well regions 110 and 310 may be formed before forming the gates and the F ion implantation. The well regions 110 and 310 may be formed first, then F ions may be implanted, and gate insulating films and gates may be formed later.

Figure 10F:
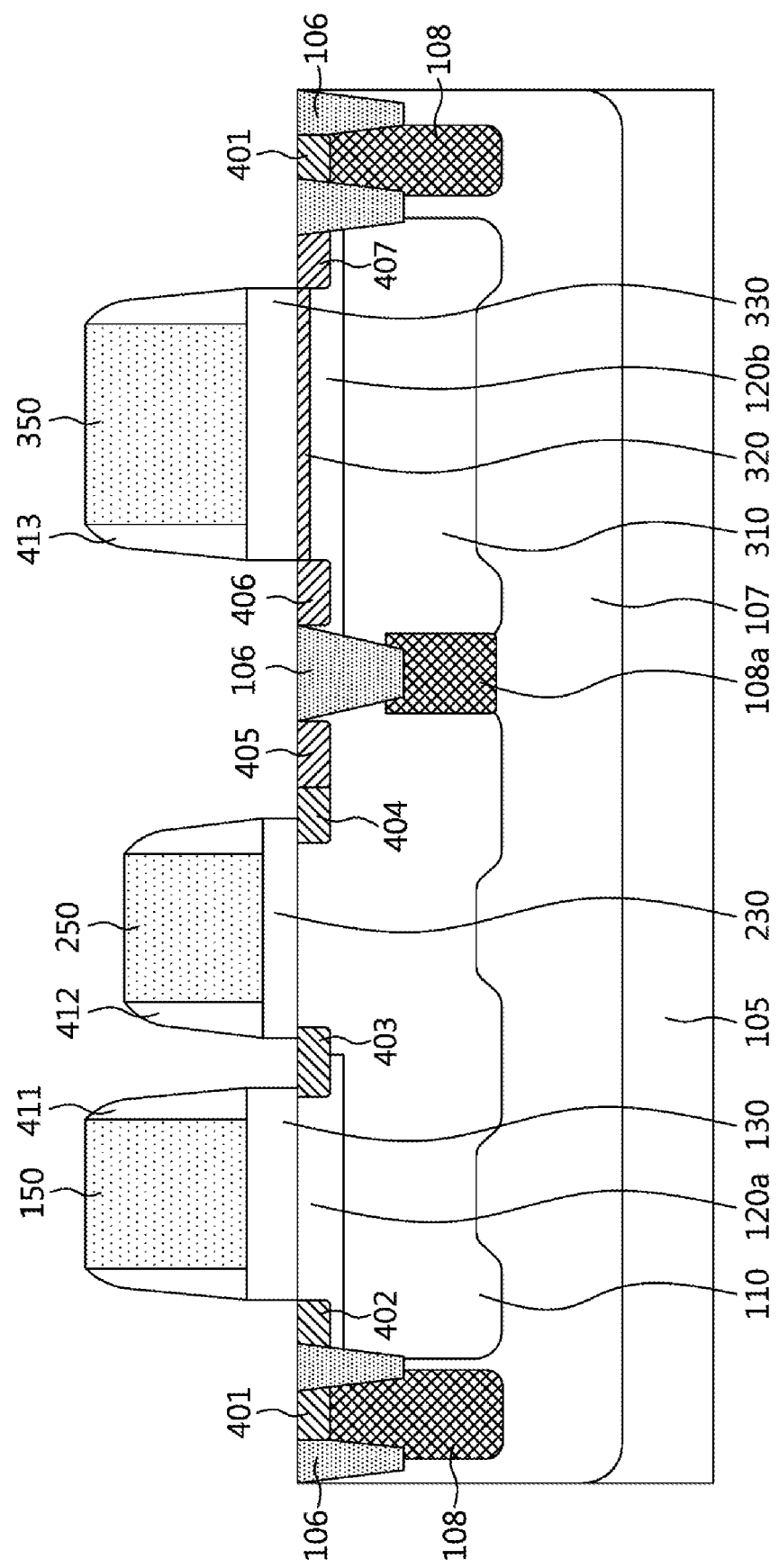

Referring to FIG. 10F, spacers 411, 412 and 413 may be formed on opposite sides of the sensing gate 150, the selection gate 250, and the control gate 350, respectively. Additionally, highly doped N+ regions 401, 402, 403 and 404 and P+ regions 405, 406 and 407 may be formed on the substrate, respectively. To form the highly doped N+ regions 401, 402, 403 and 404, an ion implantation may be performed with Arsenic ions (75As+) with 50-70 KeV ion implantation energy and $1E15\text{-}1E16/cm^2$ dose. Subsequently, an ion implantation may be performed by phosphorous ions (31P+) with 30-50 KeV ion implantation energy and $1E12\text{-}1E14/cm^2$ dose. To form the P+ regions 405, 406 and 407, an ion implantation may be performed by boron fluoride ions (49BF2) with 20-50 KeV ion implantation energy and $1E15\text{-}1E16/cm^2$ dose. Subsequently, an ion implantation may be performed by boron ions (11B+) with 20-40 KeV ion implantation energy and $1E12\text{-}1E14/cm^2$ dose. Since the N+ and P+ ion implantation energies are greater than the F ion implantation energy described above, depths of the highly doped N+ and P+ ion implantation regions may be greater than depths of the F ion implantation regions 120a and 120b. The N+ region 402 may be a drain region and the N+ region 402 is disposed in the P-type well region and adjacent to one side of the sensing gate 150. The N+ region 403, which is formed between the other side of the sensing gate 150 and one side of the selection gate 250, may be a source/drain region. The N+ region 404 formed on the other side of the selection gate 250 may be a source region.

The P+ region 405 formed to be adjacent to the source region 404 may be a pick-up region of the first P-type well region. The P+ regions 406 and 407 may be referred to as pick-up regions that are formed on opposite sides of the control gate 350 and formed in the second PW 310. The second PW 310 and the P+ regions 406 and 407 may have the same conductive type. Meanwhile, the drain region, source region, and pick-up region described above may be formed in the first P-type well region 110 and/or the second P-type well region 310.

Referring to FIG. 10G, contact plugs 170, 270, 290, 370 and 470 may be formed connected to the N+ regions 401, 402, 403 and 404 or the P+ regions 405, 406 and 407, respectively. Additionally, metal wirings 601-606 may be formed that are connected to the contact plugs, respectively. The bit line (BL) 602 may be connected to the drain region 402 electrically through the first contact plug 170. The source line (SL) 604 may be connected electrically to the source region 404 and the pick-up region 405 simultaneously through the second contact plug 270. The selection gate line (SG) or word line (WL) 603 may be connected to the selection gate 250 through the third contact plug 290. The control gate line (CG) 605 and 606 may be connected to the pick-up regions 406 and 407 through the fourth contact plug 370. The sensing gate 150 and the control gate 350 may be connected by a single poly-Si layer 701. The single poly-Si layer 701 may be the floating gate 400 as shown in FIG. 5 or FIG. 6.

The method of manufacturing the non-volatile memory device according to the disclosure may adjust a thickness of a gate insulating film by adjusting ion of an ion implantation process, without an additional oxidation process. Therefore, the process may be simplified. This may solve a conventional problem of requiring an additional oxidation process to adjust a thickness of some gate insulating films.

The non-volatile memory device using the manufacturing method of the disclosure may have a program region and an erase region separately. Accordingly, an oxidation of an oxide from a cycling of a device may be improved, resulting in improving a retention as well as a durability of the device.

Additionally, the non-volatile memory device may improve an efficiency of recording and erasing, and it is possible to reduce an area of a memory device.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
   a first trench isolation, a second trench isolation, and a third trench isolation disposed in a semiconductor substrate;
   a first P-type well (PW) region disposed between the first trench isolation and the second trench isolation, the first PW region having a depth greater than each of the first trench isolation and the second trench isolation;
   a second PW region disposed between the second trench isolation and the third trench isolation, the second PW region having a depth greater than each of the second trench isolation and the third trench isolation;
   a sensing transistor comprising a sensing gate insulating layer and a sensing gate electrode disposed on the first PW region;
   a selection transistor comprising a selection gate insulating layer and a selection gate electrode disposed on the first PW region;
   a control gate structure comprising a control gate insulating layer and a control gate electrode disposed on the second PW region; and
   a first gate-oxidation-accelerating ion implantation layer comprising dopant ions and disposed below the sensing gate insulating layer, such that the sensing gate insulating layer has a thickness greater than a thickness of the selection gate insulating layer.

2. The semiconductor device of claim 1, further comprising:
   a second gate-oxidation-accelerating ion implantation layer comprising dopant ions and disposed below the control gate insulating layer, such that the control gate insulating layer has a thickness greater than the thickness of the selection gate insulating layer.

3. The semiconductor device of claim 1, further comprising:
   a first isolation N-type well (NW) region disposed below the first trench isolation, the first isolation NW region being in contact with a bottom surface of the first trench isolation;
   a second isolation NW region disposed below the second trench isolation, the second isolation NW region being in contact with a bottom surface of the second trench isolation; and
   a third isolation NW region disposed below the third trench isolation, the third isolation NW region being in contact with a bottom surface of the third trench isolation.

4. The semiconductor device of claim 3, further comprising:
   a deep NW region surrounding the first isolation NW region, the second isolation NW region, the third isolation NW region, the first PW region, and the second PW region.

5. The semiconductor device of claim 1, further comprising:
   a logic region in the semiconductor substrate;
   a first logic PW region and a first logic N-type well (NW) region disposed in the logic region;
   a second logic PW region and a second logic NW region disposed in the logic region;
   a first N-type MOS transistor comprising a first gate insulating layer and a first gate electrode disposed on the first logic PW region;
   a first P-type MOS transistor comprising a second gate insulating layer and a second gate electrode disposed on the first logic NW region; and
   a second N-type MOS transistor comprising a third gate insulating layer and a third gate electrode disposed on the second logic PW region;
   a second P-type MOS transistor comprising a fourth gate insulating layer and a fourth gate electrode disposed on the second logic NW region.

* * * * *